US011222911B2

(12) United States Patent
Kawahito

(10) Patent No.: US 11,222,911 B2
(45) Date of Patent: Jan. 11, 2022

(54) PHOTOELECTRIC CONVERSION ELEMENT AND SOLID-STATE IMAGING DEVICE

(71) Applicant: National University Corporation Shizuoka University, Shizuoka (JP)

(72) Inventor: Shoji Kawahito, Shizuoka (JP)

(73) Assignee: NATIONAL UNIVERSITY CORPORATION SHIZUOKA UNIVERSITY

( * ) Notice: Subject to any disclaimer, the term of this patent is extended or adjusted under 35 U.S.C. 154(b) by 33 days.

(21) Appl. No.: 16/770,615

(22) PCT Filed: Dec. 7, 2018

(86) PCT No.: PCT/JP2018/045118
§ 371 (c)(1),
(2) Date: Jun. 7, 2020

(87) PCT Pub. No.: WO2019/112046
PCT Pub. Date: Jun. 13, 2019

(65) Prior Publication Data
US 2021/0175264 A1    Jun. 10, 2021

(30) Foreign Application Priority Data
Dec. 8, 2017   (JP) .............................. JP2017-236531

(51) Int. Cl.
*H01L 27/146*    (2006.01)
*H01L 31/111*    (2006.01)

(52) U.S. Cl.
CPC ........ *H01L 27/1461* (2013.01); *H01L 31/111* (2013.01)

(58) Field of Classification Search
CPC . H01L 27/1461; H01L 27/146; H01L 27/092; H01L 31/111; H01L 21/8238; H04N 5/369; H04N 5/374
See application file for complete search history.

(56) References Cited

U.S. PATENT DOCUMENTS

2003/0201518 A1* 10/2003 Mann ................ H01L 27/14623
257/659
2008/0150069 A1* 6/2008 Popovic ................ H01L 31/101
257/443

(Continued)

FOREIGN PATENT DOCUMENTS

JP    2010-56345 A    3/2010
JP    2015-177191 A   10/2015

(Continued)

OTHER PUBLICATIONS

International Search Report and Written Opinion (including translation), dated Feb. 19, 2019, for the corresponding International Application No. PCT/JP2018/045118 in 9 pages.

*Primary Examiner* — Sitaramarao S Yechuri
(74) *Attorney, Agent, or Firm* — Polsinelli PC

(57) ABSTRACT

A photoelectric conversion element encompasses a depletion-layer extension-promotion region having a p-type upper layer, a p-type photoelectric conversion layer in contact with the depletion-layer extension-promotion region, and an n-type surface-buried region buried in an upper portion of the photoelectric conversion layer, configured to implement a photodiode together with the photoelectric conversion layer. A first p-well is surrounded by a first n-tab, the first n-tab is surrounded by a second p-well, the second p-well is surrounded by a second n-tab, and the second n-tab is surrounded by a third p-well. An injection-blocking element blocks injection of carriers of opposite conductivity type to signal charges from the second p-well into the photoelectric conversion layer, and the inside of the photoelectric conversion layer is depleted by a voltage applied to the depletion-layer extension-promotion region.

8 Claims, 24 Drawing Sheets

(56) References Cited

U.S. PATENT DOCUMENTS

| | | | |
|---|---|---|---|
| 2009/0230498 A1* | 9/2009 | Iwai | H01L 31/103 |
| | | | 257/461 |
| 2011/0024808 A1 | 2/2011 | Janesick | |
| 2011/0298079 A1* | 12/2011 | Kawahito | H01L 27/14603 |
| | | | 257/443 |
| 2015/0263058 A1 | 9/2015 | Konstantin | |
| 2018/0114809 A1* | 4/2018 | Kawahito | H01L 27/146 |

FOREIGN PATENT DOCUMENTS

| | | |
|---|---|---|
| WO | WO 2010-151299 A1 | 12/2010 |
| WO | WO 2016/015791 A1 | 2/2016 |
| WO | WO 2016/157910 A1 | 10/2016 |

* cited by examiner

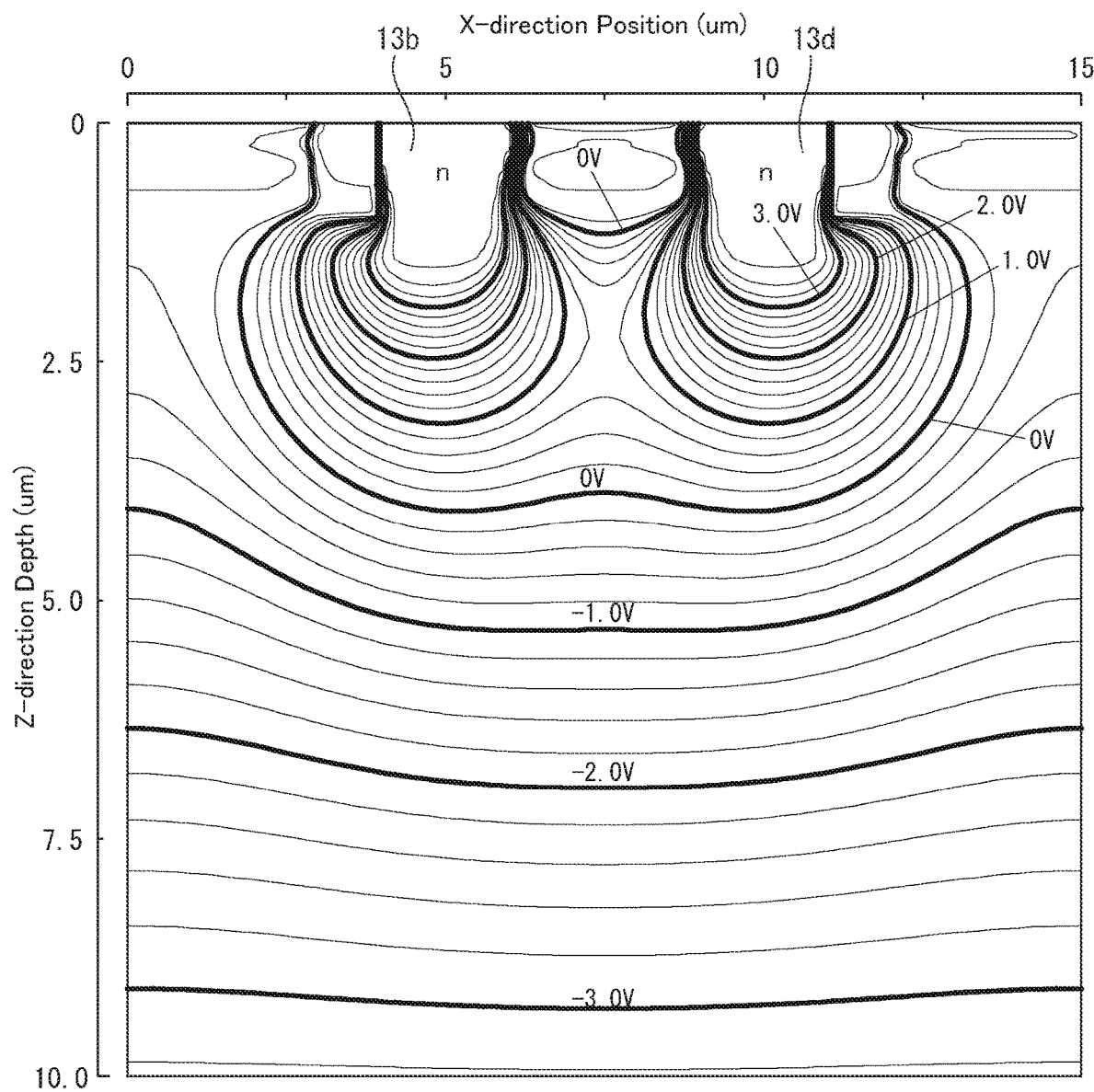

PHOTOELECTRIC CONVERSION ELEMENT AND SOLID-STATE IMAGING DEVICE

TECHNICAL FIELD

The present invention relates to a photoelectric conversion element, and a solid-state imaging device in which a plurality of the photoelectric conversion elements is arrayed as imaging pixels, and more particularly relates to a solid-state imaging device that can perform a high-speed operation.

BACKGROUND ART

As recited by Patent Literature (PTL) 1, a group of the inventors of the present invention has already proposed a range measuring element that had a function of lock-in pixels for performing an optical charge detection in synchronization with an optical pulse. In a range sensor that performs an operation of optical time-of-flight (TOF) scheme as described in the PTL 1, a component caused by slow charges moving at a diffusion velocity exists in a neutral area (epitaxial layer), in a case of aiming at a super high-speed operation of sub-nanosecond level. Thus, due to the influence of the slow component, there is a disadvantage that a targeted ultra high-speed operation cannot be performed.

If a bias potential is applied to a substrate to generate an electric field, the slow charges moving at diffusion velocity in the neutral area can be transported at a high speed. However, in a situation in which the bias potential is kept to be applied to the substrate, there is a problem that power dissipation is increased by the injection of holes that are non-signal charges from p-type semiconductor regions other than a photodiode of a pixel and p-wells of a peripheral circuit and the like.

In order to block a parasitic current between a $p^+$ substrate and a p-well, the p-well is disposed in a pixel, a structure that blocks the parasitic current between the $p^+$ substrate and the p-well, by forming an n-type buried layer for widely covering the lower portion of the p-well in a part of the pixel is proposed by PTL2. However, in the invention described in the PTL 2, there is a problem that a potential profile to transport the signal charges at a high speed cannot be achieved within the pixel.

CITATION LIST

Patent Literature

[PTL 1] WO 2016/15791A1
[PTL 2] JP 2015-177191A

SUMMARY OF INVENTION

Technical Problem

In light of the above problems, an object of the present invention is to provide a photoelectric conversion element that can perform a high-speed operation with low power dissipation, and a solid-state imaging device in which a plurality of the photoelectric conversion elements is arrayed as imaging pixels.

Solution to Problem

In order to achieve the above object, a first aspect of the present invention inheres in a photoelectric conversion element encompassing (a) a depletion-layer extension-promotion region having an upper layer of a first conductivity type, (b) a photoelectric conversion layer of the first conductivity type in contact with the upper layer of the depletion-layer extension-promotion region, having a lower impurity concentration than the upper layer, (c) a surface-buried region of a second conductivity type buried in a part of an upper portion of the photoelectric conversion layer, configured to implement a photodiode together with the photoelectric conversion layer, (d) a well region of the first conductivity type buried in another part of the upper portion of the photoelectric conversion layer, having higher impurity concentration than the photoelectric conversion layer, (e) a charge-accumulation region of the second conductivity type buried in a part of an upper portion of the well region, configured to accumulate signal charges temporally, (f) a plurality of intra-pixel circuit-elements merged in a part of the well region, configured to implement a circuit for reading out the signal charges from the charge-accumulation region, and (g) an injection-blocking element having a tab-region of the second conductivity type for dividing the well region into no less than two at least at a part of the well region, configured to block injection of non-signal charges having opposite conductivity type to the signal charges from the well region into the photoelectric conversion layer. In the photoelectric conversion element pertaining to the first aspect of the present invention, an entire range intended as a signal-charge generation-region in the photoelectric conversion layer is depleted by a voltage applied to the upper layer. Here, the first conductivity type and the second conductivity type are the conductivity types opposite to each other. That is, when the first conductivity type is the n-type, the second conductivity type is the p-type, and when the first conductivity type is the p-type, the second conductivity type is the n-type. Also, when the signal charges are electrons, the non-signal charges are holes, and when the signal charges are holes, the non-signal charges are electrons.

A second aspect of the present invention inheres in a solid-state imaging device encompassing (a) a pixel-array area having an array of a plurality of pixels and (b) a peripheral-circuit area merged on a single semiconductor chip with the pixel-array area, configured to drive the pixels and process signals from the pixels. Here, each of the pixels includes a depletion-layer extension-promotion region having an upper layer of a first conductivity type, a photoelectric conversion layer of the first conductivity type in contact with the upper layer of the depletion-layer extension-promotion region, having a lower impurity concentration than the upper layer, a surface-buried region of a second conductivity type buried in a part of an upper portion of the photoelectric conversion layer, configured to implement a photodiode together with the photoelectric conversion layer, a well region of the first conductivity type buried in another part of the upper portion of the photoelectric conversion layer, having higher impurity concentration than the photoelectric conversion layer, a charge-accumulation region of the second conductivity type buried in a part of an upper portion of the well region, configured to accumulate signal charges temporally, a plurality of intra-pixel circuit-elements merged in a part of the well region, configured to implement a circuit for reading out the signal charges from the charge-accumulation region, and an injection-blocking element having a tab-region of the second conductivity type for dividing the well region into no less than two at least at a part of the well region, configured to block injection of non-signal charges having opposite conductivity type to the signal charges from the well region into the photoelectric conversion layer. In each of the pixels arrayed in the solid-state imaging device pertaining to the second aspect of the present invention, an entire range intended as a signal-charge generation-region in the photoelectric conversion layer is depleted by a voltage applied to the upper layer.

Advantageous Effects of Invention

According to the present invention, it is possible to provide a photoelectric conversion element that can perform a high-speed operation with low power dissipation, and a solid-state imaging device in which a plurality of the photoelectric conversion elements is arrayed as imaging pixels.

BRIEF DESCRIPTION OF DRAWINGS

FIG. 13 is a two-dimensional illustration of potentials in which in a cross-section equivalent to FIG. 3, a vicinity of first and second n-tabs of the pixel in the solid-state imaging device pertaining to the embodiment is enlarged and illustrated;

DESCRIPTION OF EMBODIMENTS

Figure 1:
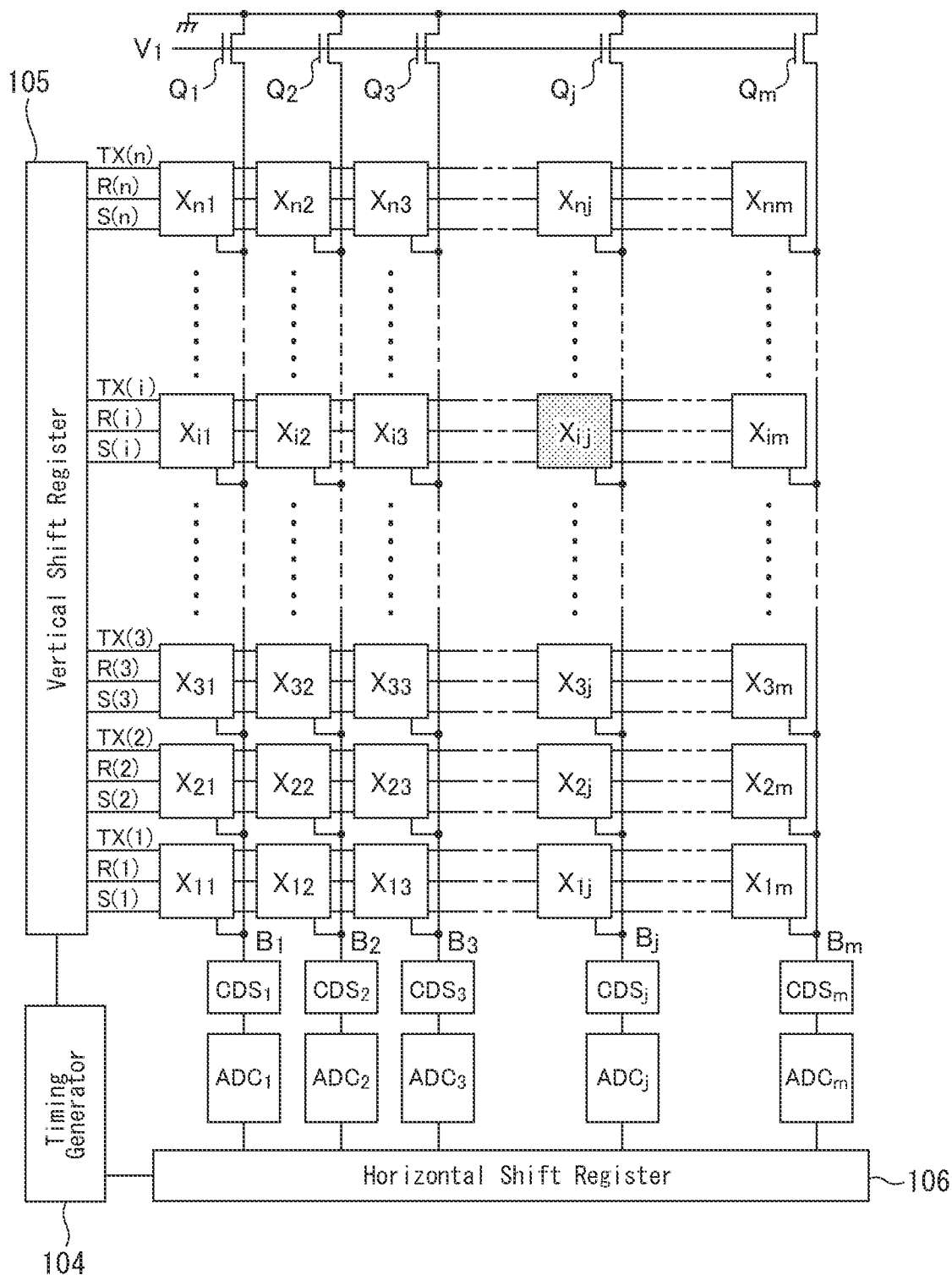
FIG. 1 is a schematic circuit diagram explaining a layout on a semiconductor chip of a solid-state imaging device (two-dimensional image sensor) pertaining to an embodiment of the present invention, the layout includes block diagram.

Next, the embodiment of the present invention will be described below, with reference to the drawings. In the following description of the drawings, the same or similar reference numeral is assigned to the same or similar portion. However, the drawing is merely diagrammatic. Thus, attention should be paid to a situation that a relationship between a thickness and a planar dimension, a ratio between thicknesses of respective layers and the like differ from the actual values. Hence, the concrete thicknesses and dimensions should be judged by referring to the following explanations. Also, it is natural that a portion in which the mutual dimensional relations and ratios differ from each other is included even between the mutual drawings.

The embodiment mentioned below exemplifies a device and a method to embody the technical idea of the present invention. Thus, the technical idea of the present invention does not specify the material, shape, structure, arrangement and others of a constituent part to the followings. Also, in the following explanations, a case in which the first conductivity type is a p-type and the second conductivity type is an n-type is exemplified. However, by inversely selecting the conductivity type, the first conductivity type may be the n-type, and the second conductivity type may be the p-type. The notation of a superscript + is labeled for n or p indicates the doping level of semiconductor region is relatively heavy compared with a semiconductor region to which + is not labeled, and the notation of a superscript − is labeled for n or p indicates the doping level of semiconductor region is relatively light compared with a semiconductor region to which − is not labeled. On the technical idea of the present invention, various changes can be performed within the technical rage described in the claims.

(Block Diagram of Solid-State Imaging Device)

In the solid-state imaging device (two-dimensional image sensor) pertaining to the embodiment of the present invention, as illustrated in FIG. 1, a pixel-array area ($X_{11}$-$X_{1m}$; $X_{21}$ to $X_{2m}$; - - -, $X_{n1}$ to $X_{nm}$) and a peripheral-circuit area (104, 105, 106, $CDS_1$ to $CDS_m$; $ADC_1$ to $ADC_m$) are merged on a single semiconductor chip. In the pixel-array area located at the center of the semiconductor chip, a plurality of pixels $X_{ij}$ (i=1 to m, and j=1 to n, and the m and the n are positive integers, respectively) are arrayed in the shape of a two-dimensional matrix, and each pixel $X_{ij}$ implements a rectangular imaging area. And, on a downside of the pixel-array area, a horizontal shift register 106 is deployed along row directions of pixels $X_{11}$-$X_{1m}$; $X_{21}$ to $X_{2m}$; $X_{n1}$ to $X_{nm}$. On a left side portion of the pixel-array area, a vertical shift register (vertical driver circuit) 105 is deployed along column directions of pixels $X_{11}$-$X_{n1}$; $X_{12}$ to $X_{n2}$; - - -; $X_{1j}$ to $X_{nj}$; - - -; $X_{1m}$ to $X_{nm}$. A timing generator 104 is connected to the vertical shift register 105 and the horizontal shift register 106.

The pixels within the pixel-array area are sequentially scanned by the timing generator 104, the horizontal shift register 106 and the vertical shift register 105, and a read-out operation of a pixel signal and an electronic-shutter operation are performed. That is, the solid-state imaging device pertaining to the embodiment of the present invention is designed in such a way that by scanning the pixel-array area in a vertical direction at the respective pixel rows $X_{11}$-$X_{1m}$; $X_{21}$ to $X_{2m}$; $X_{n1}$ to $X_{nm}$ units, the pixel signals of the respective pixel rows $X_{11}$-$X_{1m}$; $X_{21}$ to $X_{2m}$; $X_{n1}$ to $X_{nm}$ are read out by vertical signal lines $B_1$, $B_2$, $B_3$, - - -, $B_j$, - - -, $B_m$, which are allocated to the respective pixel columns $X_{11}$-$X_{n1}$; $X_{12}$ to $X_{n2}$; $X_{1j}$ to $X_{nj}$; - - -; $X_{1m}$ to $X_{nm}$.

Correlated double-sampling circuits $CDS_1$, $CDS_2$, $CDS_3$, - - -, $CDS_j$, - - - $CDS_m$ are connected to the vertical signal lines $B_1$, $B_2$, $B_3$, - - -, $B_j$, - - -, $B_m$, respectively. That is, levels based on signal charges accumulated in charge-accumulation regions are read out to the correlated double-sampling circuits $CDS_1$, - - - $CDS_m$ of a corresponding column for each horizontal line. In each of the correlated double-sampling circuits $CDS_1$, - - - $CDS_m$, amplification noise and reset noise are removed from the signal of each of the vertical signal lines $B_1$, $B_2$, $B_3$, - - -, $B_j$, - - -, $B_m$. Column-parallel A/D converters $ADC_1$, $ADC_2$, $ADC_3$, - - -, $ADC_j$, - - - $ADC_m$ are connected to output sides of the correlated double-sampling circuits $CDS_1$, $CDS_2$, $CDS_3$, - - -, $CDS_j$, - - - $CDS_m$, respectively, for each column, and the signals of the respective vertical signal lines $B_1$, $B_2$, $B_3$, - - -, $B_j$, - - -, $B_m$ are converted into digital signals.

(Chip Configuration of Pixel Etc.)

Figure 2:
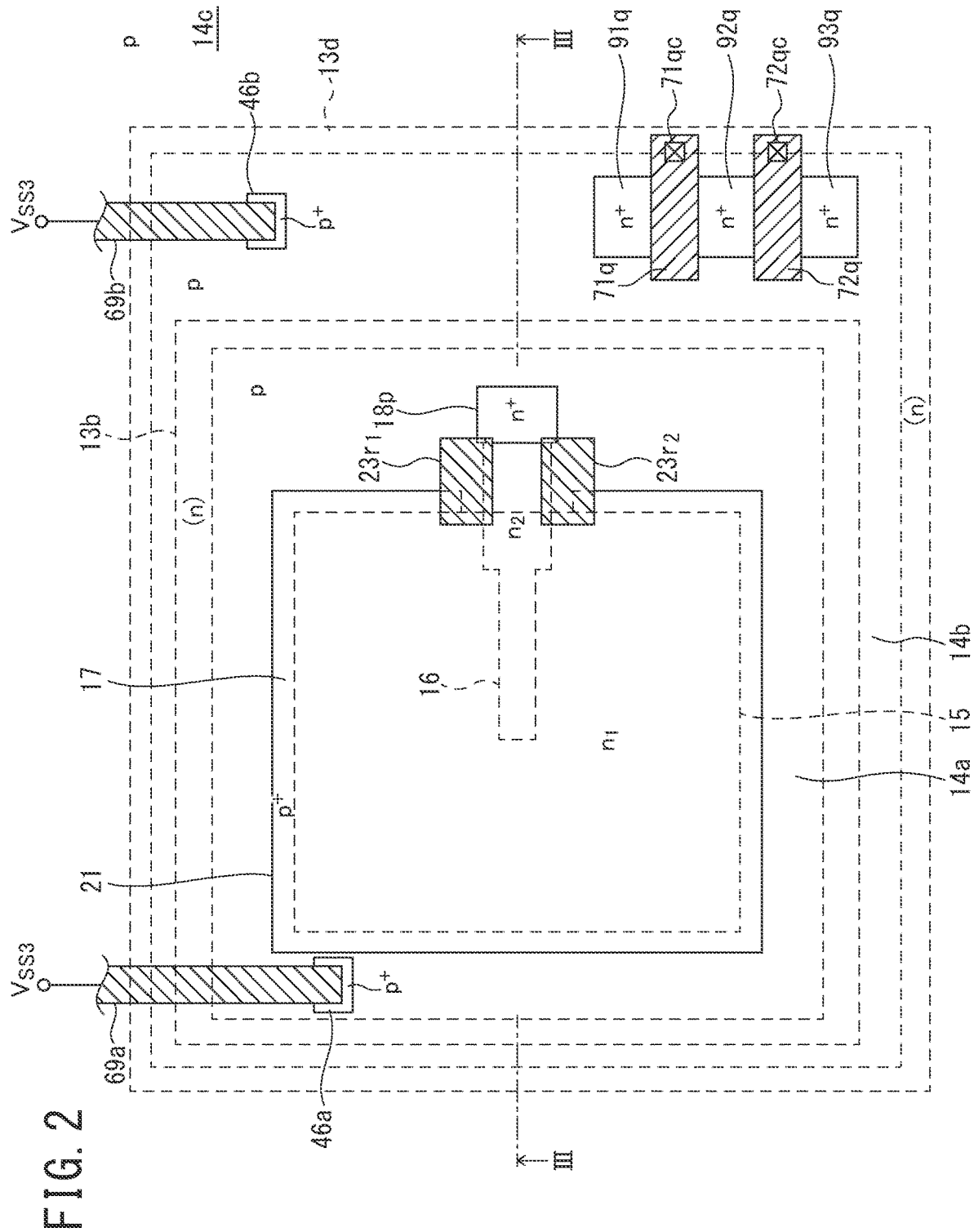
FIG. 2 is one example of a plan view illustrating an outline of a planar structure of a photoelectric conversion element, which serves as a pixel of the solid-state imaging device pertaining to the embodiment, the planar structure is viewed from above of the pixel, by omitting, or seeing through an inter-layer insulating film.
Figure 3:
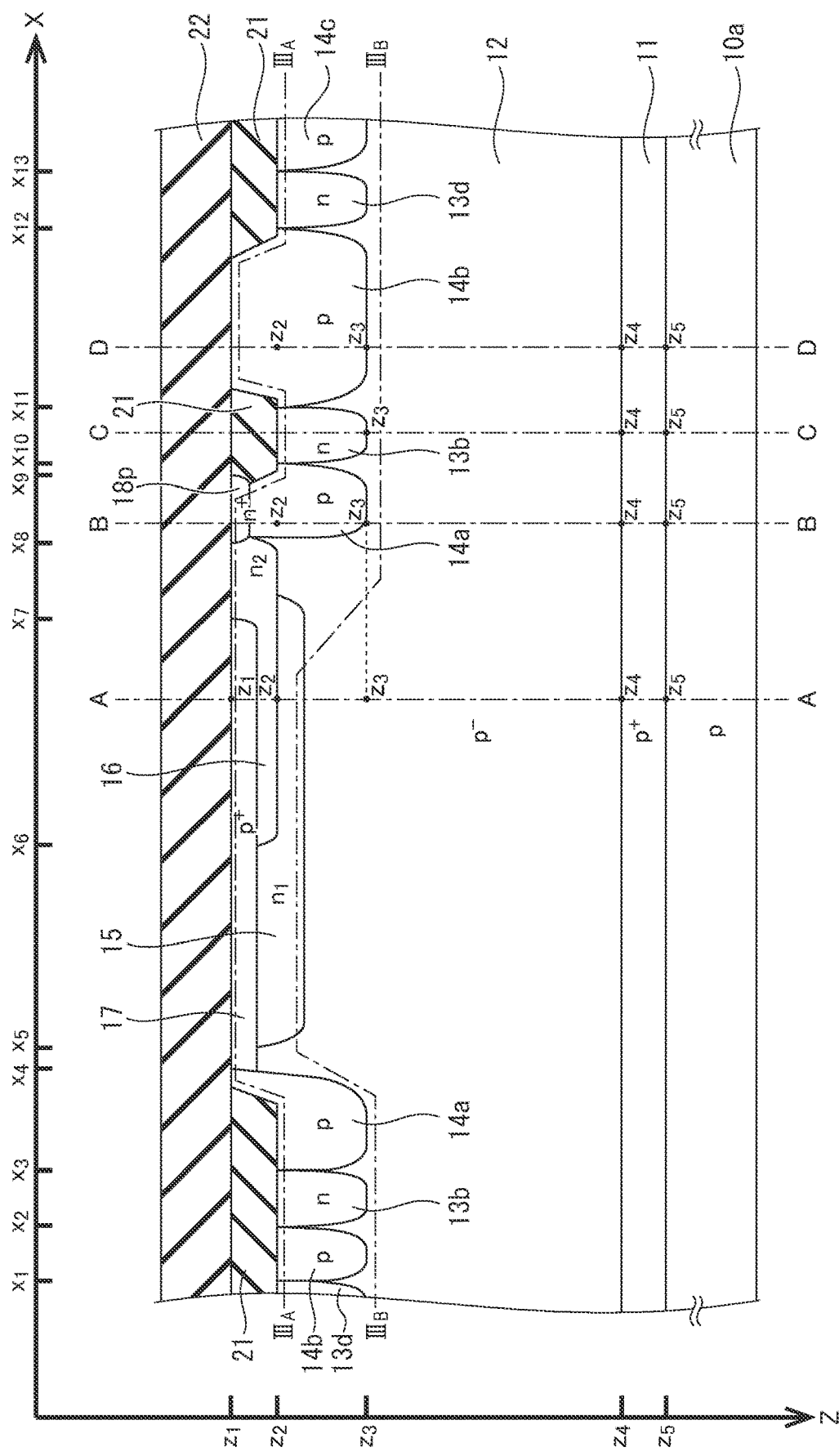
FIG. 3 is a cross-sectional view of the pixel of the solid-state imaging device pertaining to the embodiment, taken along a III-III direction of the plan view of the pixel illustrated in FIG. 2.

Hereafter, the respective pixels $X_{11}$-$X_{1m}$; $X_{21}$ to $X_{2m}$; - - -, $X_{n1}$ to $X_{nm}$ in the solid-state imaging device pertaining to the embodiment of the present invention are generically represented as the pixel and explained focusing to the generic pixel $X_{ij}$. FIG. 2 illustrates one example of the planar structure of the photoelectric conversion element implementing the pixel $X_{ij}$, and FIG. 3 illustrates a cross-sectional view corresponding to FIG. 2. On the center and left side of the planar pattern of the photoelectric conversion element illustrated in FIG. 2, a surface-buried region 15 serving as a light-receiving cathode-region (a charge-generation region) is illustrated as a rectangular area. FIG. 3 illustrates a cross-sectional structure taken from the direction of the photoelectric conversion element as the pixel $X_{ij}$ illustrated in FIG. 2. However, an inter-layer insulating film 22 illustrated in FIG. 3 is omitted in FIG. 2 so that the underlying planar pattern can be easy recognized.

The surface-buried region 15 is a semiconductor region of a second conductivity type (n-type) surrounded by a well region (first p-well) 14*a* of a first conductivity type (p-type). In the layout of the planar pattern in FIG. 2, the periphery of the area of a first p-well 14*a* is surrounded by a wall-shaped first n-type tab-region (first n-tab) 13*b*, and the first p-well 14*a* is arranged inside of the first n-tab 13*b*. The first n-tab 13*b* is surrounded by an intermediate p-type well region (second p-well) 14*b* arranged further outside. The periphery of the area of the second p-well 14*b* is surrounded by a wall-shaped second n-type tab-region (second n-tab) 13*d*, and the area of the second n-tab 13*d* is surrounded by an outer p-type well region (third p-well) 14*c* arranged further outside. Consequently, the first n-tab 13*b* and second n-tab 13*d* implement an injection-blocking element (13*b* and 13*d*). Although illustration is omitted, a light shield film may be arranged above the surface-buried region 15 so that a light shield window is aligned to a rectangular area defining the surface-buried region 15. That is, light is entered to the pixel $X_{ij}$ through the light shield window formed in the light shield film.

The cross-sectional view in FIG. 3 is merely the exemplification. However, the structure of the photoelectric conversion element illustrated in FIG. 3 represents a topology in which a large p-type well region is divided into three wells of the first p-well 14*a*, the second p-well 14*b* and the third p-well 14*c*. At least at a part of the large p-type well region, the first p-well 14*a*, the second p-well 14*b* and the third p-well 14*c* are divided. That is, in a localized limited area illustrated in the cross-sectional view in FIG. 3, the first n-tab 13*b* and the second n-tab 13*d* - - double n-type tab-regions - - - implement a structure in which the three p-type well regions of the first p-well 14*a*, the second p-well 14*b* and the third p-well 14*c* are deployed. As illustrated in FIG. 3, the topology is a wall-shaped pattern in which an aspect ratio of a depth to a width of the first n-tab 13*b* and the second n-tab 13*d* is large. Thus, areas of the first n-tab 13b and the second n-tab 13d that occupy in the pixel are small. For this reason, an area efficiency of the pixel $X_{ij}$ of the solid-state imaging device pertaining to the embodiment is high, which can make the pixel $X_{ij}$ finer. Also, due to the lateral miniaturized structures of the p-well and the n-well, in other words, due to the spatial derivation of space charges, a potential is generated which facilitates a high-speed lateral transport of the charges. As described later by using FIG. 17, a topology implemented by the n-type tab-regions that can be locally regarded as double tab-regions is not limited to the configuration corresponding to the double rectangular ring as illustrated in FIG. 2. Thus, it is possible to achieve various topologies. For example, as a local cross-sectional structure, it is allowed to include a partial structure that can be regarded as four or more divided topologies. Furthermore, the target to be divided may be an area common to an adjacent pixel. That is, any division architecture can be used, which corresponds to a topology based upon a large p-well common to two pixels adjacent to each other, and the large p-well is divided into n (n is a positive integer of two or more).

In the planar pattern illustrated in FIG. 2, because a pair of electric-field control-electrodes $23r_1$ and $23r_2$ is provided on both sides of a guide region 16, through static induction effect, signal charges are controlled to be transported through the guide region 16 by a lateral electric fields induced by the electric-field control-electrodes $23r_1$ and $23r_2$ so that the signal charges can be transferred to a charge-accumulation region 18p. An n⁺ type charge-accumulation region 18p is provided in the first p-well 14a as a floating drain region, at a position located on the right side of the electric-field control-electrodes $23r_1$ and $23r_2$. An electrostatic potential in the guide region 16, sandwiched in between the upper electric-field control-electrode $23r_1$ and the lower electric-field control-electrode $23r_2$, is controlled by the lateral electric field so that the signal charges are transported through the guide region 16, and thereby the signal charges are transferred to the charge-accumulation region 18p, when a voltage is applied to the electric-field control-electrodes $23r_1$ and $23r_2$. A p⁺ type p-well contact region 46a is provided at a left-upper position of the first p-well 14a in FIG. 2, and a lower-potential power-supply voltage $V_{SS3}$ is applied through a surface interconnection 69a to the p-well contact region 46a.

The right-lower pattern in FIG. 2 schematically illustrates a planar layout of a part of a group of MOS transistors implementing "intra-pixel circuit-elements" such as reset transistors, signal read-out transistors, switching transistors and the like. Although illustration of concrete circuit connections between the intra-pixel circuit-elements is omitted, a drain electrode of a signal read-out transistor (amplification transistor) for reading out the signal charges from the charge-accumulation region 18p is connected to a power supply VDD, and a source electrode is connected to a drain electrode of a switching transistor for pixel selection. The source electrode of the switching transistor for pixel selection that is the other one of the circuit elements for reading out the signal charges from the charge-accumulation region 18p is connected to a vertical signal line $B_j$, and to a gate electrode, a control signal S for selecting a horizontal line is given from the vertical shift register 105 (see FIG. 1). By setting the selection control signal S to a high (H) level, the switching transistor is turned on, and a current corresponding to a potential of the charge-accumulation region 18p amplified by the signal read-out transistor (amplification transistor) is made to flow through the vertical signal line $B_j$.

That is, in order to schematically explain a part of the group of MOS transistors implementing the intra-pixel circuit-elements, FIG. 2 exemplifies a configuration in which gate electrodes 71q and 72q are arranged in the second p-well 14b. Moreover, source/drain electrodes 91q, 92q and 93q in the group of MOS transistors are arranged in a configuration such that source/drain electrodes 91q, 92q and 93q sandwich each of the gate electrodes 71q and 72q. Moreover, as illustrated in FIG. 2, a p⁺ type p-well contact region 46b is provided at a right-upper position of the second p-well 14b, and the lower-potential power-supply voltage $V_{SS3}$ is applied through the surface interconnection 69b to the p-well contact region 46b.

As illustrated in FIG. 3, the pixel $X_{ij}$ of the solid-state imaging device pertaining to the embodiment encompasses "a depletion-layer extension-promotion region (10a and 11)" of the present invention. The structure of the depletion-layer extension-promotion region (10a and 11) includes a p-type semiconductor substrate 10a and a p⁺ type bottom-side bias-layer 11 provided on the semiconductor substrate 10a, and the bottom-side bias-layer 11 has higher impurity concentration than the semiconductor substrate 10a. And, a p⁻ type photoelectric conversion layer 12 having lower impurity concentration than the semiconductor substrate 10a is provided on the bottom-side bias-layer 11 implementing the upper layer of the depletion-layer extension-promotion region (10a and 11), and the n-type surface-buried region 15 is provided on the photoelectric conversion layer 12. As illustrated in FIG. 3, the wall-shaped first n-tab 13b and second n-tab 13d are locally embedded under an element-isolation insulating-film 21 implementing a shallow trench isolation (STI) structure. The first n-tab 13b and the second n-tab 13d implement an injection-blocking element (13b and 13a).

Moreover, as understood from FIG. 3, the element-isolation insulating-film 21 surrounds even a rectangular pattern of a pinning layer 17 arranged on a charge-generation region. The STI technique may be used to implement the element-isolation insulating-film 21 by embedding a filed insulating film in a shallow trench (groove) for element isolation, while the field insulating film by selective oxidation such as silicon local oxidation (LOCOS) method, or the LOCOS film can be used as the element-isolation insulating-film 21. Also, since the third p-well 14c located around the pixel $X_{ij}$ is locally buried under the element-isolation insulating-film 21, the third p-well 14c serves as the pixel isolation region of the solid-state imaging device.

As illustrated in FIG. 3, on the upper portion of the right side of the surface-buried region 15, the n-type guide region 16 having a higher impurity concentration $n_2$ than an impurity concentration $n_1$ ($n_2 > n_1$) of the surface-buried region 15 is provided, so that the end of the guide region 16 can arrive at the charge-accumulation region 18p. As understood from FIG. 2, the guide region 16 is delineated in a pattern, which spreads wider and wider with a step, on the center of the right side of the surface-buried region 15, and implements a path through which the signal charges are accelerated by potential gradient generated by the guide region 16. On the surface-buried region 15, the p⁺ type pinning layer 17 is provided which has higher impurity concentration than the first p-well 14a, and the guide region 16 is sandwiched between the pinning layer 17 and the surface-buried region 15.

The photodiode is implemented by the surface-buried region 15 serving as a light-receiving cathode-region and the photoelectric conversion layer 12 serving as a light-receiving anode-region just under the surface-buried region 15.

The signal charges (electrons) generated in the photoelectric conversion layer 12 are injected into a part of the surface-buried region 15 just on the photoelectric conversion layer 12 and introduced to the guide region 16. An inter-layer insulating film 22 covers the entire surface including the upper surface of the pinning layer 17. Furthermore, the inter-layer insulating film 22 covers the electric-field control-electrodes $23r_1$ and $23r_2$, although the illustrations of the electric-field control-electrodes $23r_1$ and $23r_2$ are omitted because they are located on the rear side and front side of a paper surface of FIG. 3, respectively.

Figure 4:
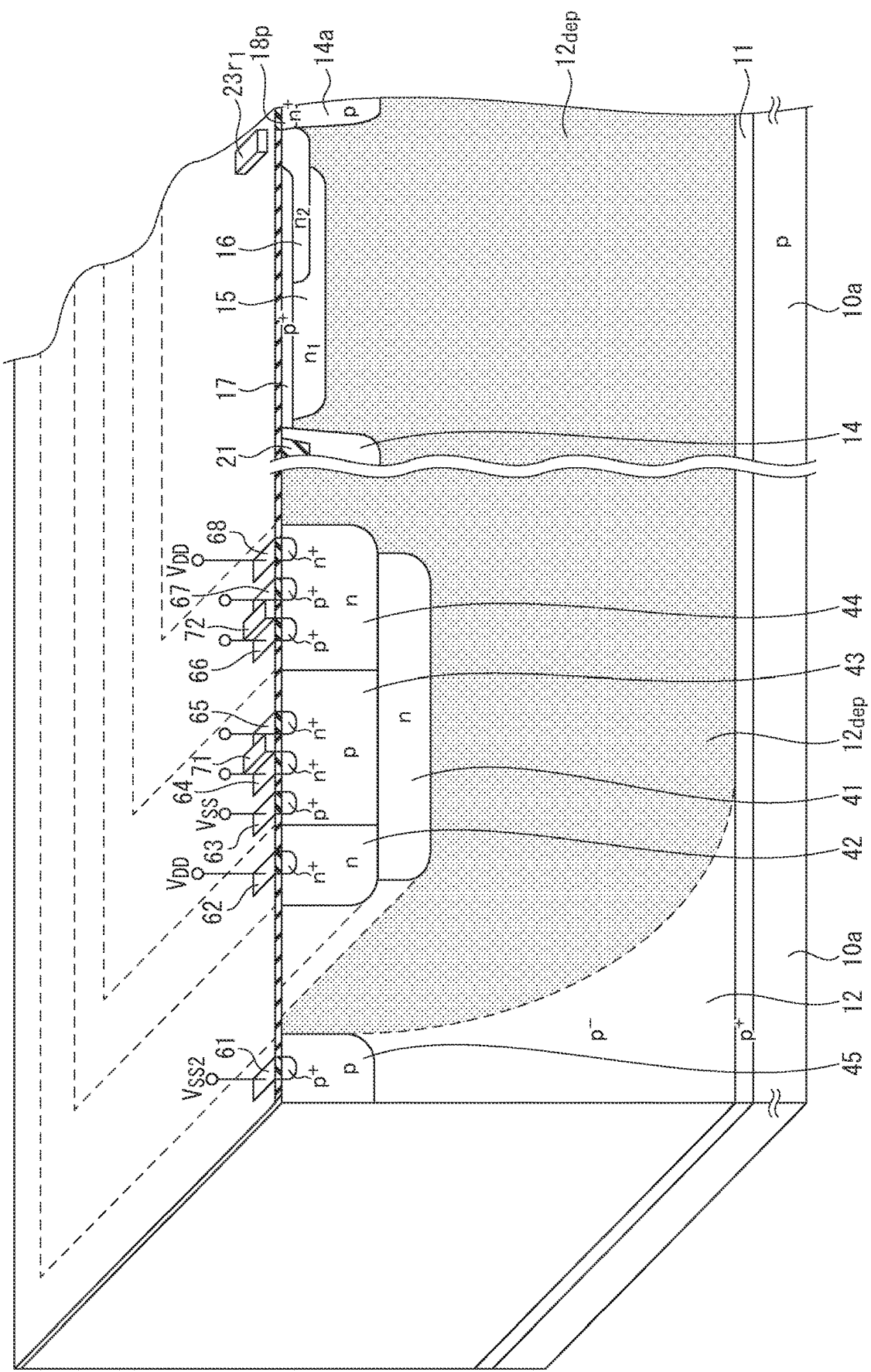
FIG. 4 is a bird's-eye and cross-sectional view focusing on a periphery of the semiconductor chip of the solid-state imaging device pertaining to the embodiment.

In the solid-state imaging device pertaining to the embodiment, as illustrated in FIG. 4, a p-type tab-region 45 is provided along the periphery of the semiconductor chip, and a p$^+$ type tab contact region 61 is buried in the tab-region 45. Since a power supply voltage $V_{SS2}$ (=$V_B$) of negative value is applied to the tab contact region 61, a depletion layer $12_{dep}$ extends to the photoelectric conversion layer 12 as illustrated in FIG. 4.

As already illustrated in FIG. 1, the peripheral-circuit area (104, 105, 106, $CDS_1$ to $CDS_m$; $ADC_1$ to $ADC_m$) such as the vertical shift register 105, the horizontal shift register 106, the timing generator 104 and the like are integrated around the pixel-array area ($X_{11}$-$X_{1m}$; $X_{21}$ to $X_{2m}$; - - - , $X_{n1}$ to $X_{nm}$). FIG. 4 schematically illustrates a partial configuration of the peripheral-circuit area (104, 105, 106, $CDS_1$ to $CDS_m$; $ADC_1$ to $ADC_m$) as a CMOS circuit implemented by a p-well 43 and an n-well 44, which is adjacent to the inside of the p-well 43. The n-well 44 is provided on the right side of the p-well 43 in the cross-section in FIG. 4. Because a structure of the pixel $X_{ij}$ illustrated at the right end of the cross-sectional portion in FIG. 4 is equivalent to the cross-sectional structure illustrated in FIG. 3, the duplicate explanation is omitted.

As illustrated in FIG. 4, the p-well 43 and the n-well 44 are arranged on the peripheral side of the semiconductor chip, along the positions surrounding the periphery of the pixel-array area ($X_{11}$-$X_{1m}$; $X_{21}$ to $X_{2m}$; - - - , $X_{n1}$ to $X_{nm}$), a part of the pixel-array area is illustrated on the right side of the cross-sectional view in FIG. 4. An n$^+$ type source region 64, an n$^+$ type drain region 65 and a p$^+$ type p-well contact region 63 are arranged in the p-well 43. A gate electrode 71 is provided between the source region 64 and the drain region 65. Thus, FIG. 4 schematically exemplifies that an nMOS transistor is constructed by the source region 64, the drain region 65 and the gate electrode 71.

On the other hand, a p$^+$ type source region 66, a p$^+$ type drain region 67 and an n$^+$ type n-well contact region 68 are arranged in the n-well 44 located on the side inner than the p-well 43. A gate electrode 72 is provided between the source region 66 and the drain region 67. Then, FIG. 4 schematically illustrates a case in which the source region 66, the drain region 67 and the gate electrode 72 implement a pMOS transistor. An n-type sinker region 42 is provided adjacently outside the p-well 43 implementing a part of the peripheral-circuit area (104, 105, 106, $CDS_1$ to $CDS_m$; $ADC_1$ to $ADC_m$), and an n$^+$ type sinker contact region 62 is provided in the sinker region 42, where the n-type sinker region 42 is provided at the left side in the cross-section in FIG. 4. An n-type shield region 41 connected to the lower surface of the sinker region 42 substantially covers the lower surfaces of the p-well 43 and the n-well 44 which implement a part of the peripheral-circuit area (104, 105, 106, $NC_1$ to $NC_m$). Differently from a shield region 13a implementing the injection-blocking element of the pixel $X_{ij}$ side, a neutral area is allowed to remain in the shield region 41. Thus, an impurity concentration of the shield region 41 can be set to a value higher than an impurity concentration of the shield region 13a. A power supply voltage $V_{SS}$ is applied to the p-well contact region 63, and a power supply voltage $V_{DD}$ is applied to the n-well contact region 68, and the power supply voltage $V_{DD}$ is applied to the sinker contact region 62.

By the way, FIG. 4 illustrates a structure in which the sinker region 42 is provided on the outmost side, and the p-well 43 is provided inside the sinker region 42, and the n-well 44 is provided further inside the p-well 43. However, the above structure is merely the exemplification. It is possible to arbitrarily select the permutation combination of arrangement and array of the sinker region 42, the p-well 43 and the n-well 44. For example, the p-well 43 may be arranged on the outmost side. Also, the sinker region 42 is omitted, and a function equivalent to the sinker region 42 may be given to the n-well 44.

In the solid-state imaging device pertaining to the embodiment, as illustrated in FIG. 4, the p-type tab-region 45 is provided in a shape of ring along the periphery of the semiconductor chip implementing the solid-state imaging device, and "a bottom-voltage supply-portion" is built. On the upper portion of the tab-region 45, the p$^+$ type tab contact region 61 is buried so as to expose its upper surface, and the power supply voltage $V_{SS2}$ is applied to the tab contact region 61.

Because the tab-region 45, serves as a constituent member, or the "bottom-voltage supply-portion" for supplying the bottom voltage $V_B$ to the bottom-side bias-layer 11, which serves as "an upper layer" of the depletion-layer extension-promotion region (10a and 11), the tab-region 45 is preferred to be formed as deep as possible so that its depth becomes a distance substantially enabling the arrival at the bottom-side bias-layer 11. FIG. 4 illustrates an example in which the bottom-voltage supply-portion is implemented by a p-type impurity-diffused layer. However, a deep trench (penetration hole) arriving at the bottom-side bias-layer 11 may be dug by an ion milling or reactive ion etching (RIE) method, and p-type impurities may be diffused to a side wall of the penetration hole. Moreover, by embedding DOPOS or refractory metal such as tungsten (W), titanium (Ti) and the like in the penetration hole, a "silicon penetration electrode", or the "Through Silicon Vias (TSV)", may be constructed so that the TSV can be used as the bottom-voltage supply-portion.

The depletion layer $12_{dep}$ is designed to extend to the respective pixels implementing the solid-state imaging device pertaining to the embodiment, and to arrive at a boundary of the tab-region 45, which is disposed in a periphery of the semiconductor chip, as illustrated in FIG. 4. Thus, FIG. 4. illustrates a situation that the substantially entire region of the p-type photoelectric conversion layer 12 is depleted. When an diffusion length of an electron in silicon is defined as L$\alpha$=18 micrometers and an exponential attenuation of light in the photoelectric conversion layer 12 with respect to the light of a wavelength 870 nanometers is considered, the number of electrons generated in the photoelectric conversion layer 12 can be calculated as illustrated in Table 1.

TABLE 1

| Depth (in micrometers) from Surface of Photoelectric Conversion Layer | Percentage (%) of Number of Electrons Generated in Photoelectric Conversion Layer to the entire electrons |
|---|---|
| 0-∞ | 100 |
| 0-6 | 28 |
| 0-10 | 42 |
| 6-10 | 14 |

From Table 1, when a neutral area exists in the photoelectric conversion layer 12, it is understood that a component of the fast electrons (signal charges), which lie in a region to the depth of six micrometers from the surface of the photoelectric conversion layer 12 is 28%. And, Table 1 illustrates a component of the slow signal charges, which move at a diffusion velocity in the neutral area, defined in a region to the depth of six to ten micrometers, or a deeper portion of the photoelectric conversion layer 12, is 14%. In order to operate the respective pixels implementing the solid-state imaging device pertaining to the embodiment at a high speed, it is necessary to transfer the electrons (signal charges) in a region to the depth of ten micrometers from the surface of the photoelectric conversion layer 12 of each pixel Thus, it is necessary to deplete a portion to the depth of ten micrometers from the surface of the photoelectric conversion layer 12. By depleting the entire of the photoelectric conversion layer 12 substantially, the signal charges generated in the photoelectric conversion layer 12 can be moved by a drift electric field at a high speed.

In the cross-sectional structure illustrated in FIGS. 3 and 4, the impurity concentration and conductivity type of the semiconductor substrate 10a are not limited in particular. For example, if we focus to the exemplified p-type semiconductor, the conductivity type associated with the impurity concentration may be represented as the "p⁻ type" or the "p⁺ type". In the solid-state imaging device pertaining to the embodiment, the impurity concentration of the bottom-side bias-layer 11 implementing "the upper layer" of the depletion-layer extension-promotion region (10a and 11) is important. The impurity concentration of the bottom-side bias-layer 11 laminated on the semiconductor substrate 10a is set to the p⁺ type semiconductor layer of about $3\times10^{18}$ to $2\times10^{19}$ cm⁻³. With the p⁺ type semiconductor layer having the impurity concentration of about $3\times10^{18}$ to $2\times10^{19}$ cm⁻³, for example, and when the p-type impurity concentration of the semiconductor substrate 10a is set to about $4\times10^{16}$ to $1\times10^{18}$ cm⁻³, the impurity concentration of the photoelectric conversion layer 12 serving as the charge-generation region shall be set to the p⁻ type semiconductor layer of about $6\times10^{11}$ to $2\times10^{15}$ cm⁻³, which is lower than the impurity concentration of the semiconductor substrate 10a.

For example, when the impurity concentration of the photoelectric conversion layer 12 is set to $6\times10^{13}$ to $1.5\times10^{15}$ cm⁻³, a thickness of the photoelectric conversion layer 12 can be designed as about 4 to 20 micrometers, preferably, about 6 to 15 micrometers. For the surface-buried region 15, it is possible to employ a value of an impurity concentration of about $5\times10^{14}$ to $5\times10^{16}$ cm⁻³, representatively, for example, about $1\times10^{15}$ cm⁻³. The depth of the surface-buried region 15 can be set to about 0.1 micrometer to 3 micrometers, preferably, about 0.5 micrometer to 1.5 micrometers.

Figure 5:
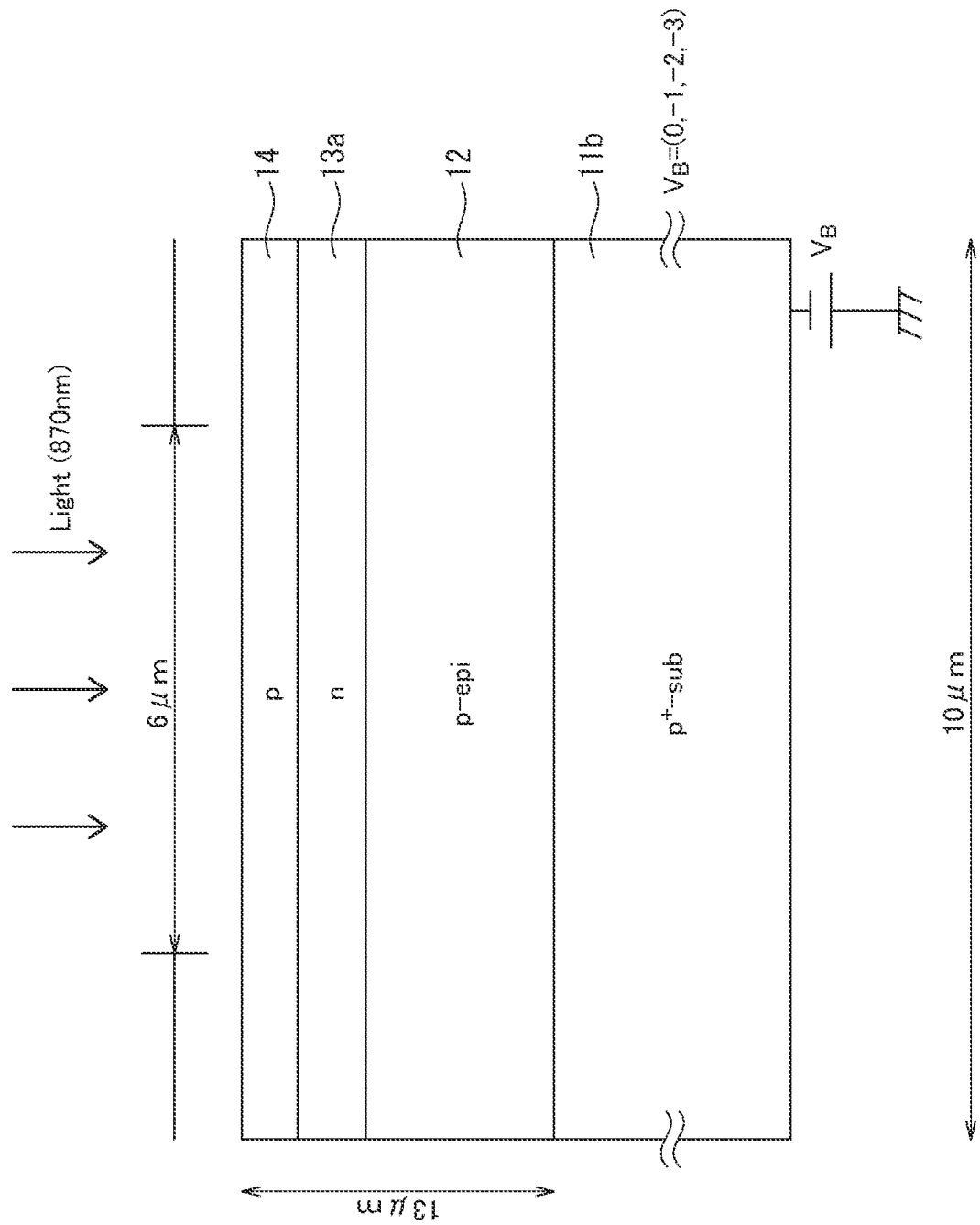
FIG. 5 is a cross-sectional view diagrammatically explaining a structure of a main portion of the pixel of the solid-state imaging device pertaining to the embodiment.
Figure 6:
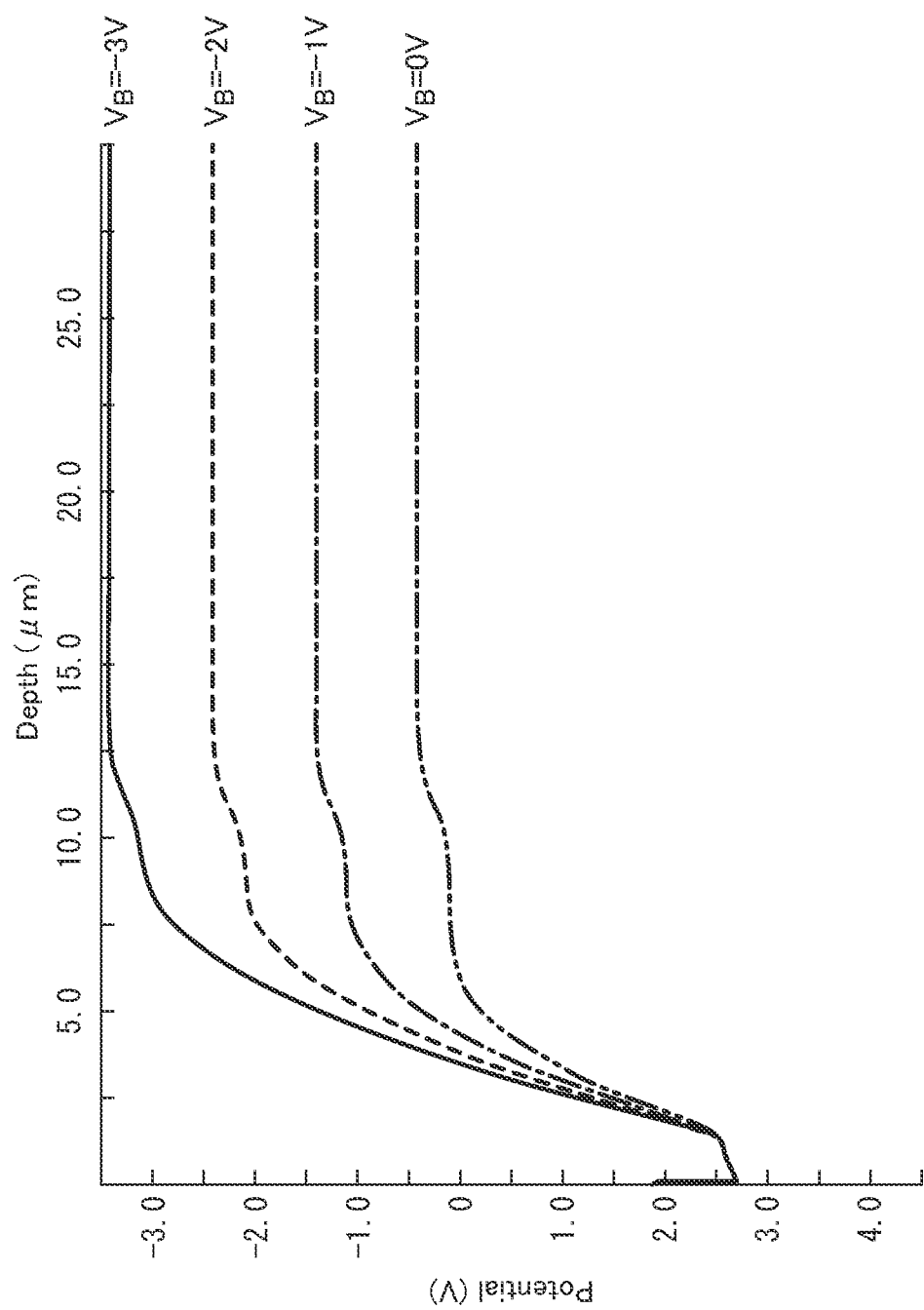
FIG. 6 is a view illustrating changes of potentials in a depth direction, when a bottom voltage $V_B$ applied to a bottom-side bias-layer is changed, in the schematic structure illustrated in FIG. 5.

FIG. 6 illustrates a change of a potential in a depth direction when, in the schematic structure illustrated in FIG. 5, the bottom voltage $V_B$ applied to the bottom-side bias-layer 11b implementing the upper layer of the depletion-layer extension-promotion region (10a and 11) is changed to 0 volt, −1 volt, −2 volts and −3 volts. In a case of the bottom voltage $V_B$=0 volt indicated by a two-dot chain line in FIG. 6, a depletion layer width can be estimated to extend to about six micrometers from a surface of a silicon epitaxial layer (12, 13a and 14). On the other hand, in a case of the bottom voltage $V_B$=−1 volt indicated by a one-dot chain line in FIG. 6, the depletion layer width can be estimated to extend to about eight micrometers from the surface of the silicon epitaxial layer (12, 13a and 14).

Also, in a case of the bottom voltage $V_B$=−2 volts indicated by a broken line in FIG. 6, a depletion layer width can be estimated to extend to about nine micrometers from the surface of the silicon epitaxial layer (12, 13a and 14), and in a case of the bottom voltage $V_B$=−3 volts indicated by a solid line, the depletion layer width can be estimated to extend to about 11 micrometers from the surface. That is, when a voltage of about $V_B$=−2 volts is applied to the bottom-side bias-layer 11b, it is understood that the depletion layer extends from the surface to about nine micrometers in the depth direction and the signal charges generated at the deep position of the photoelectric conversion layer 12, the position is designed to serve as the signal-charge generation-region, can be transported at a high speed.

Figure 7:
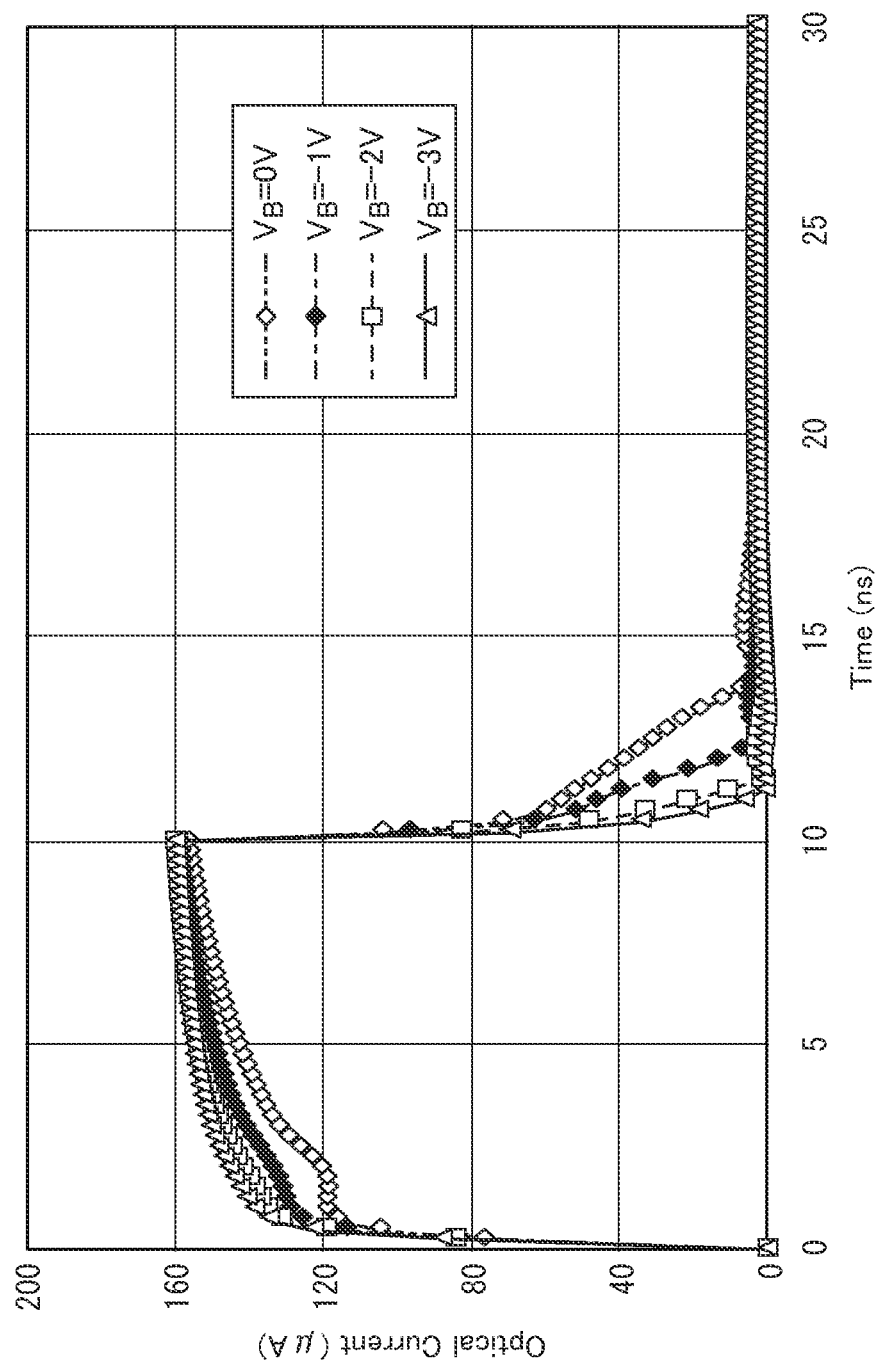
FIG. 7 is a view illustrating a transient response of photocurrents when a bottom voltage $V_B$ is changed, in the schematic structure illustrated in FIG. 5.

FIG. 7 illustrates changes of optical current responses when in the structure schematically illustrated as a representative example in FIG. 5, the bottom voltage $V_B$ applied to the bottom-side bias-layer 11b is changed to 0 volt, −1 volt, −2 volts and −3 volts. Data in FIG. 7 indicates transient responses of optical currents when a parallel light of a wavelength 870 nanometers and a pulse width 10 ns is irradiated to the surface of the silicon epitaxial layer (12, 13a and 14). In FIG. 7, a response curve indicated by plot points of open rhombic (◇), which are connected by a two-dot chain line, is the transient response of the optical current in a situation in which the bottom voltage $V_B$=0 volt is applied. When the bottom voltage $V_B$=0 volt is applied, a fall time is understood to be about 3.6 nanoseconds and slow, also as illustrated in Table 2.

On the other hand, in FIG. 7, a response curve indicated by plot points of closed rhombic (◆), which are connected by a one-dot chain line, is the transient response of the optical current in a situation in which the bottom voltage $V_B$=−1 volt is applied. When the bottom voltage $V_B$=−1 volt is applied, the fall time can be judged to be about 1.7 nanoseconds as illustrated in Table 2. Also, in FIG. 7, in a case of a response curve in a situation in which a bottom voltage $V_B$=−2 volts is applied as illustrated by plot points of open squares (□), which are connected by a broken line, the fall time is about 0.7 nanosecond, and in a case of a response curve in a situation in which a bottom voltage $V_B$=−3 volts is applied as illustrated by plot points of open triangles (Δ), which are connected by a solid line, the fall time is about 0.5 nanosecond. Thus, it is understood that the fall time can be decreased to about 0.5 nanosecond.

TABLE 2

| Bottom Voltage $V_B$ (V) | Fall Time of Optical Current Response (ns) |
|---|---|
| 0 | 3.6 |
| −1 | 1.7 |
| −2 | 0.7 |
| −3 | 0.5 |

In Table 1, although a layer having the depth of ten micrometers from the surface of the photoelectric conversion layer 12 is assumed to serve as the signal-charge generation-region, and it is described that entire signal-charge generation-region shall be depleted. However, the depth of the signal-charge generation-region is merely exemplification. For example, when the thickness of the photoelectric conversion layer 12 is assumed to be about 20 micrometers, for depleting the entire region being scheduled as the signal-charge generation-region of the photoelectric conversion layer 12, a bottom voltage $V_B$ larger than the value illustrated in Table 2 shall be applied.

(Potential Profile)

Figure 8:
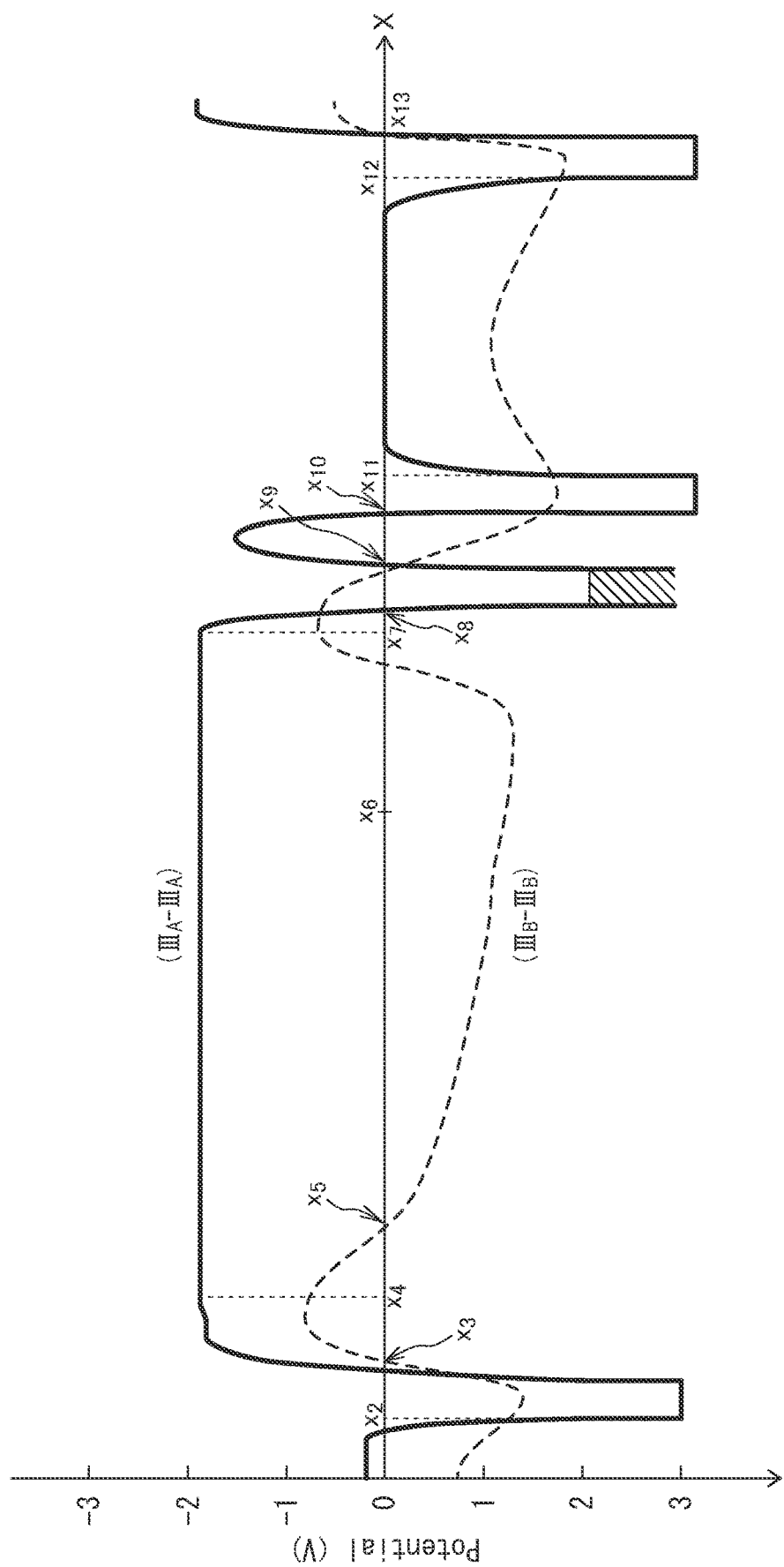
FIG. 8 illustrates potential profiles, in which a solid line represents a potential profile along a $III_A$-$III_A$ direction in FIG. 3, and a broken line represents a potential profile along a $III_B$-$III_B$ direction in FIG. 3.

As the upper side of FIG. 3 illustrates position coordinates $x_1, x_2, x_3, ---, x_{13}$ in a planar direction (X direction), a curve indicated by a solid line in FIG. 8 illustrates a potential profile along the $III_A$-$III_A$ direction of the pixels illustrated in FIG. 3. Also, a curve indicated by a broken line in FIG. 8 represents a potential profile along the $III_B$-$III_B$ direction of the pixels $X_{ij}$ illustrated in FIG. 3. The solid line represents a stepwise potential profile having a horizontal plateau between the coordinates $x_4$ and $x_7$ indicating an approximately constant potential in the range between the coordinates $x_4$ and $x_7$ and a potential well at positions between the coordinates $x_8$ and $x_9$. The stepwise curve indicated by the solid line corresponds to a potential profile along the $III_A$-$III_A$ direction, the direction passes through at the top surface side of the pixel, which is close to the position of the inter-layer insulating film 22. The curve of the solid line represents the approximately constant potential in the range between the coordinates $x_4$ and $x_7$, the range corresponding to an area of the pinning layer 17 surrounded by the first p-well 14a. The potential well at positions between the coordinates $x_8$ and $x_9$ corresponds to an area of the charge-accumulation region 18p. Moreover, the horizontal potential profile at shallow positions along the $III_A$-$III_A$ direction indicates a potential valley at a position between the coordinates $x_2$ and $x_3$, another potential valley at a position between the coordinates $x_{10}$ to $x_{11}$ and a still another potential valley at a position between the coordinates $x_{12}$ and $x_{13}$. The potential valleys at the positions between the coordinates $x_2$ and $x_3$ and between $x_{10}$ to $x_{11}$ correspond to areas of the first n-tab 13b, and the potential valley at the position between the coordinates $x_{12}$ and $x_{13}$ corresponds to an area of the second n-tab 13d. And, the potential profile indicates a potential hill sandwiched between the two potential valleys, at a position between the coordinates $x_{11}$ and $x_{12}$, which corresponds to an area of the second p-well 14b.

On the other hand, the broken line in FIG. 8 represents the potential profile along the $III_B$-$III_B$ direction, which corresponds to deep positions separated from the inter-layer insulating film 22, and the broken line represents shallow potential valleys at the positions between the coordinates $x_2$ and $x_3$ and between $x_{10}$ and $x_{11}$, which corresponds to the areas of the first n-tab 13b. Furthermore, the broken line represents another shallow potential valley at the position between the coordinates $x_{12}$ and $x_{13}$, which corresponds to the area of the second n-tab 13d. And, the broken line represents a relatively low potential hill sandwiched between two shallow potential valleys at the position between the coordinates $x_{11}$ and $x_{12}$, which corresponds to the area of the second p-well 14b, the potential in the relatively low potential hill changes gently. In particular, the horizontal potential profile at the deep positions along the $III_B$-$III_B$ direction indicates an inclination of declining gradient toward the position between the coordinates $x_8$ and $x_9$, which corresponds to the area of the charge-accumulation region 18p, in the range between the coordinates $x_4$ and $x_7$, which corresponds to the area of the pinning layer 17 surrounded by the first p-well 14a, as indicated by the broken line. However, the broken line represents a potential barrier at the position between the coordinates $x_7$ and $x_8$, which corresponds to the area just before the charge-accumulation region 18p. Moreover, the horizontal potential profile at the deep positions along the $III_B$-$III_B$ direction represents a potential mountain even at the position between the coordinates $x_3$ and $x_4$, which corresponds to the area of the first p-well 14a on the left side of FIG. 8. As indicated by the curve of the broken line along the $III_B$-$III_B$ direction in FIG. 8, between the coordinates $x_4$ and $x_7$, the potential profile having the inclination of the declining gradient is generated, which facilitates the transport of the signal charges at a high speed.

Figure 9:
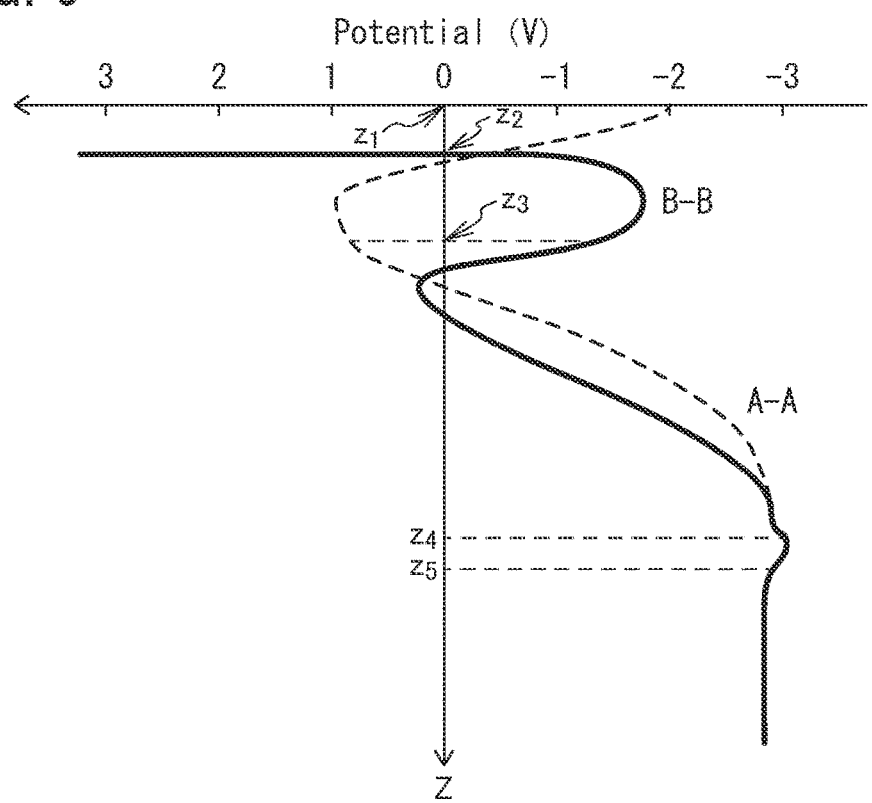
FIG. 9 illustrates potential profiles, in which a broken line represents a potential profile along an A-A direction in FIG. 3, and a solid line represents a potential profile along a B-B direction in FIG. 3.

As the left side of FIG. 3 illustrates position coordinates $z_1, z_2, z_3, ---, z_5$ in a depth direction (Z direction), a curve indicated by a broken line in FIG. 9 indicates a potential profile along an A-A direction of the pixels illustrated in FIG. 3. Also, a curve of a solid line in FIG. 9 indicates a potential profile along a B-B direction of the pixels $X_{ij}$ illustrated in FIG. 3. As the cross-sectional line along the A-A direction passes through the inter-layer insulating film 22, the pinning layer 17, the guide region 16, the surface-buried region 15, the photoelectric conversion layer 12, the bottom-side bias-layer 11 and the semiconductor substrate 10a in a depth direction, the potential profile represents a negative value from a depth level at the coordinate $z_1$, which corresponds to a depth level of a lower surface of the inter-layer insulating film 22 to a depth level at the coordinate $z_2$, which corresponds to a depth level of a lower surface of the charge-accumulation region 18p, as indicated by the broken line in FIG. 9. Then, the potential profile along the A-A direction changes to a positive value at the vicinity of the depth level of the lower surface of the charge-accumulation region 18p. The curve indicated by the broken line in FIG. 9 represents the positive potential value from the vicinity of the depth level of the lower surface of the charge-accumulation region 18p to a depth level at the coordinate $z_3$, which corresponds to a depth level of a lower surface of the first p-well 14a, and returns to the negative potential value at the level of the area close to the lower surface of the first p-well 14a in the photoelectric conversion layer 12. And, as the broken line goes along the depth direction of the photoelectric conversion layer 12, the negative potential value becomes larger toward a position between the coordinates $z_4$ and $z_5$ which corresponds to a depth level of the bottom-side bias-layer 11. Then, the broken line represents a rightward-convex shape in FIG. 9 so that the maximum value appears in the bottom-side bias-layer 11 between the coordinates $z_4$ and $z_5$, and the potential becomes constant in the semiconductor substrate 10a.

On the other hand, a potential profile along the B-B direction in FIG. 3 is illustrated by a solid line in FIG. 9. As the cross-sectional line along the B-B direction passes through the charge-accumulation region 18p, the first p-well 14a, the photoelectric conversion layer 12, the bottom-side bias-layer 11 and the semiconductor substrate 10a in the depth direction, the potential profile represents a positive value from a depth level at the coordinate $z_1$, which corresponds to the depth level of the lower surface of the inter-layer insulating film 22 to the level at the coordinate $z_2$, which corresponds to the depth level of the lower surface of the charge-accumulation region 18p, and changes to a negative value at the vicinity of the depth level of the lower surface of the charge-accumulation region 18p. The curve indicated by the solid line in FIG. 9 represents the negative potential value from the vicinity of the depth level of the lower surface of the charge-accumulation region 18$p$ to the level at the coordinate $z_3$, which corresponds to the depth level of the lower surface of the first p-well 14$a$. However, it is understood that the potential profile along the B-B direction represents the positive potential value once at the level of the area close to the lower surface of the first p-well 14$a$ in the photoelectric conversion layer 12, and the potential profile establishes a potential barrier against holes, wherein the holes are non-signal charges, at the vicinity of the lower surface of the first p-well 14$a$. When the curve indicated by the solid line, representing the potential profile along the B-B direction, goes to the deeper portion away from the lower surface of the first p-well 14$a$ in the photoelectric conversion layer 12, the potential profile along the B-B direction returns to the negative potential value. And, as the solid line goes to the deeper portion in the photoelectric conversion layer 12, the negative potential value becomes larger, and at the position between the coordinates $z_4$ and $z_5$, which corresponds to the depth level of the bottom-side bias-layer 11, the maximum value appears. Then, the solid line represents the rightward convex shape between the coordinates $z_4$ and $z_5$, and the potential becomes constant in the semiconductor substrate 10$a$.

Figure 10:
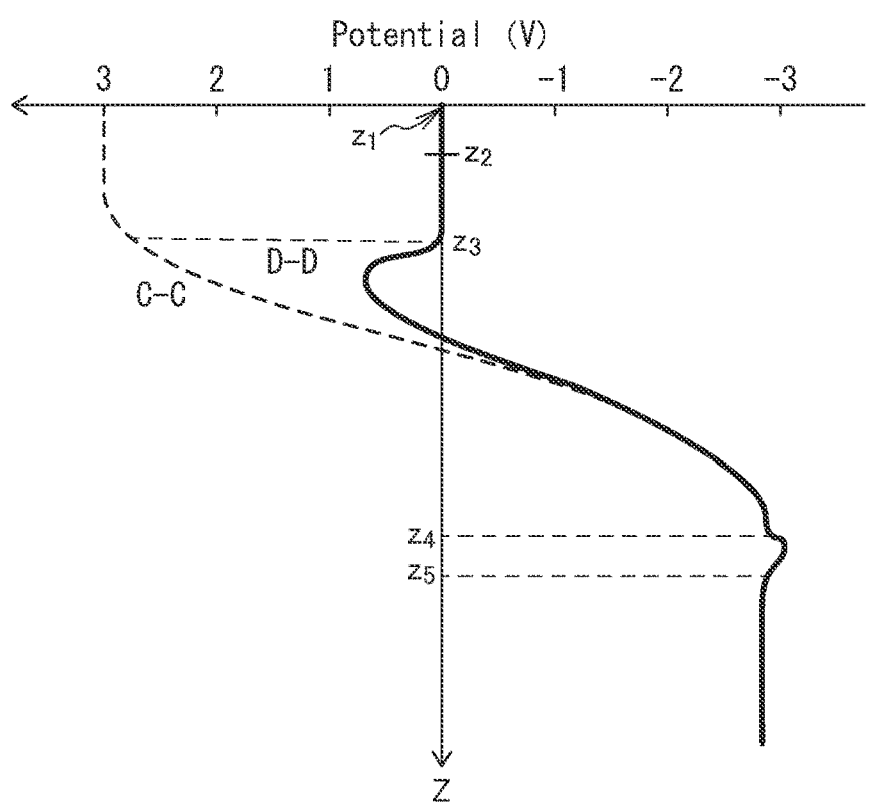
FIG. 10 illustrates potential profiles, in which a broken line represents a potential profile along a C-C direction in FIG. 3, and a solid line represents a potential profile along a D-D direction in FIG. 3.

A curve indicated by a broken line in FIG. 10 indicates a potential profile along a C-C direction of the pixels $X_{ij}$ illustrated in FIG. 3, and a curve indicated by a solid line indicates a potential profile along a D-D direction of the pixels $X_{ij}$ illustrated in FIG. 3. As the cross-sectional line along the C-C direction passes through the inter-layer insulating film 22, the element-isolation insulating-film 21, the first n-tab 13$b$, the photoelectric conversion layer 12, the bottom-side bias-layer 11 and the semiconductor substrate 10$a$ in the depth direction, the potential profile represents an approximately constant positive value from the depth level at the coordinate $z_1$, which corresponds to the depth level of the lower surface of the inter-layer insulating film 22 to the depth level at the coordinate $z_3$, which corresponds to the depth level of the lower surface of the first n-tab 13$b$, as indicated by the broken line, and as the broken line goes to the deeper portion than the depth level of the lower surface of the first n-tab 13$b$, the value of the potential is reduced to approach a zero potential. The curve indicated by the broken line in FIG. 10 becomes the negative value at the level of the area close to the lower surface of the first n-tab 13$b$ in the photoelectric conversion layer 12. And, as the broken line goes to the deeper portion in the photoelectric conversion layer 12, the negative potential value becomes larger, and at the positions between the coordinates $z_4$ and $z_5$, which corresponds to the depth level of the bottom-side bias-layer 11, the maximum value appears. Then, the broken line represents the rightward convex shape between the coordinates $z_4$ and $z_5$, and the potential becomes constant in the semiconductor substrate 10$a$.

As to the curve indicated by the solid line indicating the potential profile along a D-D direction in FIG. 3, as the cross-sectional line along the D-D direction passes through the inter-layer insulating film 22, the second p-well 14$b$, the photoelectric conversion layer 12, the bottom-side bias-layer 11 and the semiconductor substrate 10$a$ in the depth direction, as illustrated in FIG. 10, the solid line represents a zero potential, which is constant from the depth level at the coordinate $z_1$ corresponding to the depth level of the lower surface of the inter-layer insulating film 22 to the depth level at the coordinate $z_3$ corresponding to the depth level of the lower surface of the second p-well 14$b$. However, as the solid line goes to the deeper portion than the depth level of the lower surface of the second p-well 14$b$, a regime of the positive potential value is generated once. The regime of the positive potential value establishes a potential barrier against holes, wherein the holes are non-signal charges. The potential barrier is illustrated at the vicinity of the lower surface of the second p-well 14$b$. After that, as the solid line representing the potential profile along the D-D direction further goes along the depth direction, the solid line becomes the negative value at the level of the area close to the lower surface of the second p-well 14$b$ in the photoelectric conversion layer 12. And, as the solid line goes to the deep direction in the photoelectric conversion layer 12, the negative potential value becomes larger, and at the position between the coordinates $z_4$ and $z_5$, which corresponds to the depth level of the bottom-side bias-layer 11, the maximum value appears. Then, the solid line represents the rightward convex between the coordinates $z_4$ and $z_5$, and thereafter, the potential is constant in the semiconductor substrate 10$a$.

Figure 11:
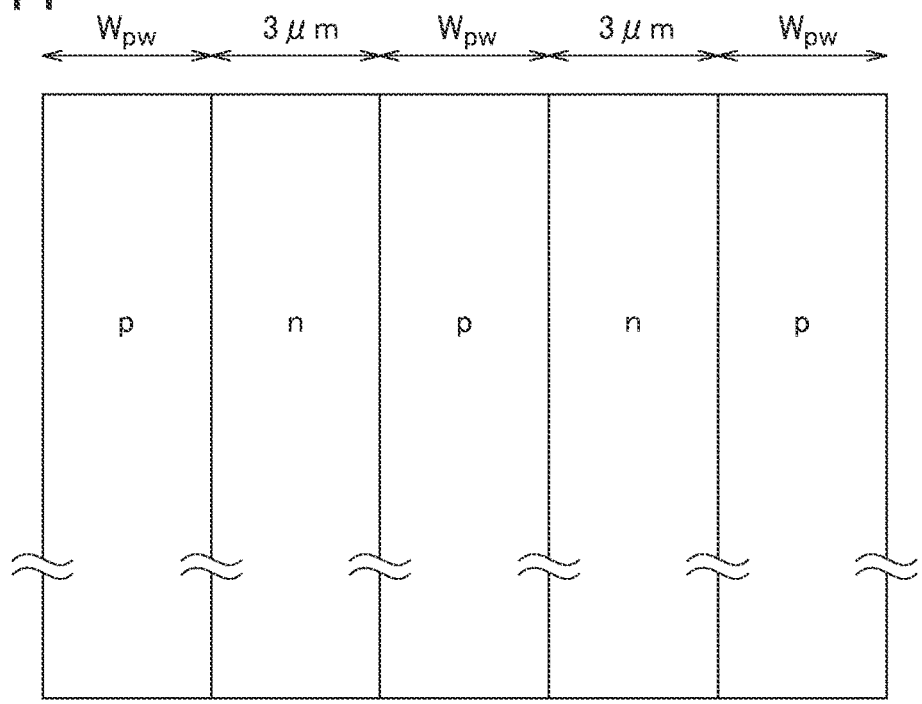
FIG. 11 illustrates a planar pattern in which in a structure where n-type semiconductor regions having a stripe width of three micrometer and p-type semiconductor regions having a stripe width of $W_{PW}$ (micrometer) are arrayed alternately and cyclically, so that a potential generated in a p-type photoelectric conversion layer under a p-type semiconductor region (second p-well) can be simulated by changing a value of the $W_{PW}$.
Figure 12:
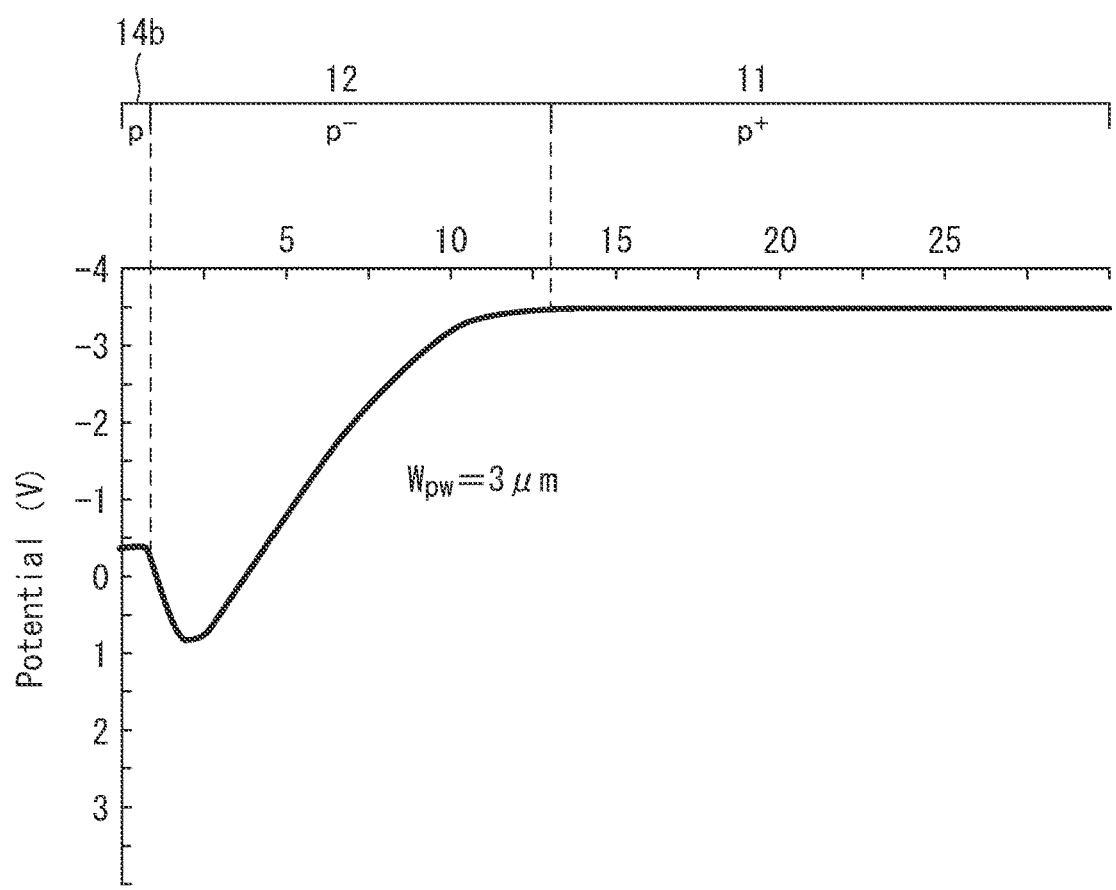
FIG. 12 is a view illustrating a phenomenon that, when the stripe width of the p-type semiconductor region $W_{PW}$=3 micrometer, a potential barrier of about one volt is generated in a p-type photoelectric conversion layer under a second p-well.

FIG. 11 is a planar pattern for simulating the potential profile, in which n-type areas having a stripe width of three micrometers and p-type areas having a stripe width of $W_{PW}$ (in micrometers) are arrayed alternately and cyclically. By the planar pattern illustrated in FIG. 11, a potential generated in the region corresponding to the p-type photoelectric conversion layer 12 under the p-type semiconductor region (second p-well) 14$b$ in FIG. 3 can be simulated by changing the value of $W_{PW}$. As illustrated in FIG. 12, when the stripe width is set to be $W_{PW}$=three micrometers, a potential barrier of about one volt appears. In FIG. 12, the potential barrier is generated in the region corresponding to the p-type photoelectric conversion layer 12, which is deployed under the second p-well 14$b$.

FIG. 13 is a two-dimensional potential profile with the pattern illustrated in FIG. 11, the potential profile is illustrated on a cross-section equivalent to FIG. 3. In FIG. 1, areas corresponding to the vicinities of the first n-tab 13$b$ and the second n-tab 13$d$ of the pixel $X_j$ in the solid-state imaging device pertaining to the embodiment are enlarged. As can be understood from FIG. 13, equi-potential lines corresponding to a situation in which the second p-well 14$b$ is set to a ground potential (=0 volt) and +3.6 volts is applied to each of the first n-tab 13$b$ and the second n-tab 13$d$ and the bottom voltage $V_B$=−3 volts is applied from the lower side of FIG. 13 are indicated at every 0.2 volt. Although illustration is omitted, electric field lines extend from the lower ends of the first n-tab 13$b$ and the second n-tab 13$d$ toward a lower side (bottom surface) so as to be orthogonal to the equi-potential lines in FIG. 13, in accordance with the Gauss's law. As can be understood from a distribution of the equi-potential lines in FIG. 13, with the potentials due to the electric field lines radiating out from the lower ends of the double tab-regions of the first n-tab 13$b$ and the second n-tab 13$d$, respectively, a potential barrier of about one volt is generated just under a region corresponding to the second p-well 14$b$ sandwiched between the first n-tab 13$b$ and the second n-tab 13$d$. That is, a positive area whose potential is between 0.2 and 0.8 volt exists even just under the region corresponding to the second p-well 14$b$ sandwiched between the first n-tab 13$b$ and the second n-tab 13$d$. Thus, at the vicinity of the lower surface of the second p-well 14$b$, a potential barrier of about one volt against the holes serving as the non-signal charges are known to be generated, thereby implementing the injection-blocking element (13$b$ and 13$d$). The potential profile illustrated in FIG. 12 coincides with even the two-dimensional distribution of the potentials in the region corresponding to the vicinity of the lower surface of the second p-well 14b indicated by the equi-potential lines in FIG. 13.

As mentioned above, according to the structure of the pixel $X_{ij}$ in the solid-state imaging device pertaining to the embodiment, while transporting the signal charges at high-speed, the potential barrier is generated against the holes serving as the non-signal charges, it is possible to avoid the increase in power dissipation due to the injection of the holes. In particular, the advantageous feature, in which the lateral electric fields induced by the electric-field control-electrodes $23r_1$ and $23r_2$ facilitates the high-speed transport of the signal charges, can be made more significant and effectively by depleting the whole of the photoelectric conversion layer 12. In particular, the first p-well 14a is surrounded in the shape of wall by the first n-tab 13b, the first n-tab 13b is surrounded by the second p-well 14b, the second p-well 14b is surrounded in the shape of wall by the second n-tab 13d, the second n-tab 13d is surrounded by the third p-well 14c, and the potential barrier for blocking the injection of the holes is generated just under the first p-well 14a and the second p-well 14b, and the injection-blocking element (13b and 13d) is accordingly implemented. Thus, the power dissipation is not increased. Because the potential profile achieved by the structure of the injection-blocking element (13b and 13d) does not disturb the gradient of the potentials generated in the guide region 16, it is possible to perform the high-speed charge transfer, in which the transport of the signal charges is accelerated by the potential gradient.

(Manufacturing Method)

Using the step cross-sectional views illustrated in FIGS. 14 to 15, in which attention is focused to the structure of the pixel $X_{ij}$ portion, the outline of the manufacturing method of the solid-state imaging device pertaining to the embodiment of the present invention will be explained. By the way, the manufacturing method of the solid-state imaging device as mentioned below is merely one example. Within the scope achieving the structure of the solid-state imaging device described in the claims, it is naturally possible to use various manufacturing methods other than the method illustrated with FIGS. 14 to 15, including the modifications. Also, nomenclature of "first to seventh implantation-masks" or the like in the following explanation is merely a convenience of the nomenclature, distinguishing from other photo masks at a different order in the series of steps, for the purpose of explaining the series of steps of the manufacturing method. Thus, the nomenclature does not define the actual name and order of an actual photo mask.

(a) At first, a semiconductor substrate 10a, whose main surface is (100) plane of about 0.1 to 3 ohm-centimeter, is prepared by a p-type silicon substrate. Then, by a vapor-phase growth-method, which uses hydrogen ($H_2$) as carrier gas, diborane ($B_2H_6$) as doping gas, and monosilane ($SiH_4$) as source gas, a "$p^+$ type" bottom-side bias-layer 11a is epitaxially grown to a thickness of three to five micrometers on the semiconductor substrate 10a. The impurity concentration of bottom-side bias-layer 11 is $3\times10^{18}$ to $2\times10^{19}$ $cm^{-3}$. In the same reaction tube, a flow rate of the $B_2H_6$ is decreased and then, the vapor-phase growth-method using the $SiH_4$ is continued to epitaxially grow a "$p^-$ type" lower-level photoelectric conversion layer 12 whose impurity concentration is $5\times10^{12}$ to $1\times10^{14}$ $cm^{-3}$ to a thickness of 8 to 25 micrometers, as illustrated in FIG. 14 (a). At the initial timing of the continuous epitaxial growth of $p^+$ to $p^-$, it is allowed to stop the introduction of the $B_2H_6$, and add a trace amount of arsine ($AsH_4$) or phosphine ($PH_3$) so that the change of the impurity concentration at the interface can establish a steep profile.

Figure 14A:
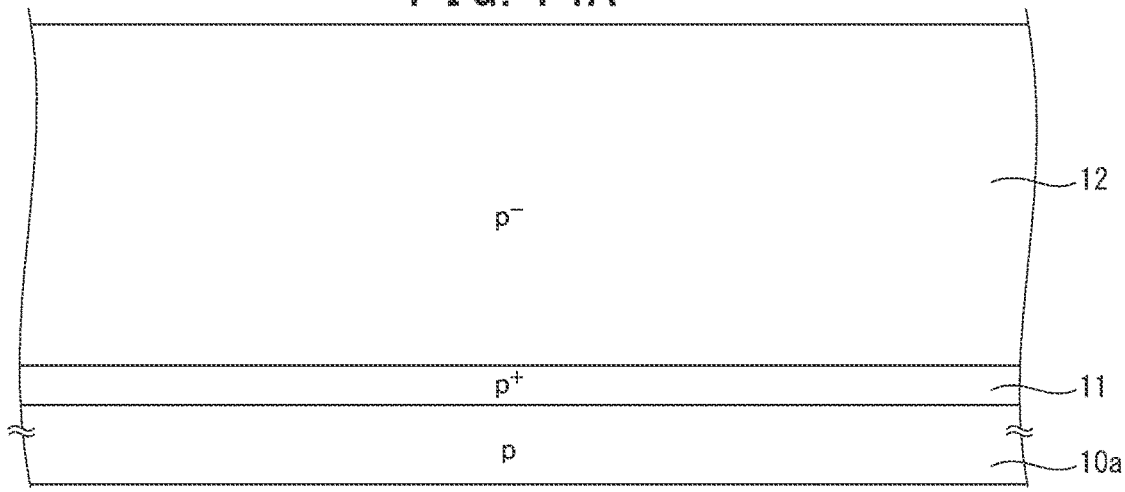
FIG. 14 illustrates schematic step cross-sectional views explaining a manufacturing method of the solid-state imaging device pertaining to the embodiment, by focusing on a structure of a pixel.
Figure 14B:
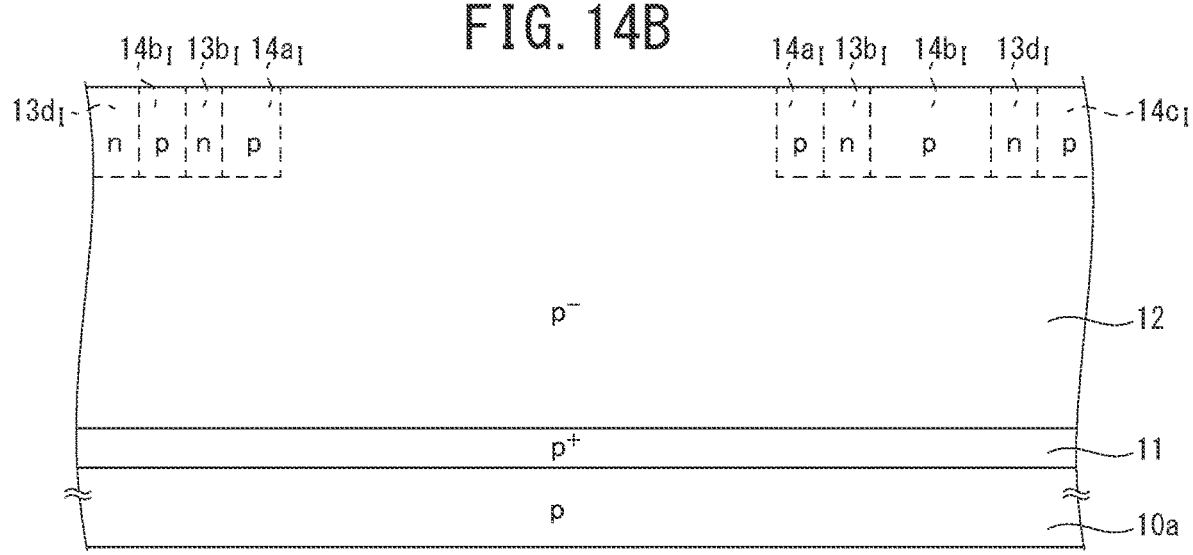
Figure 14C:
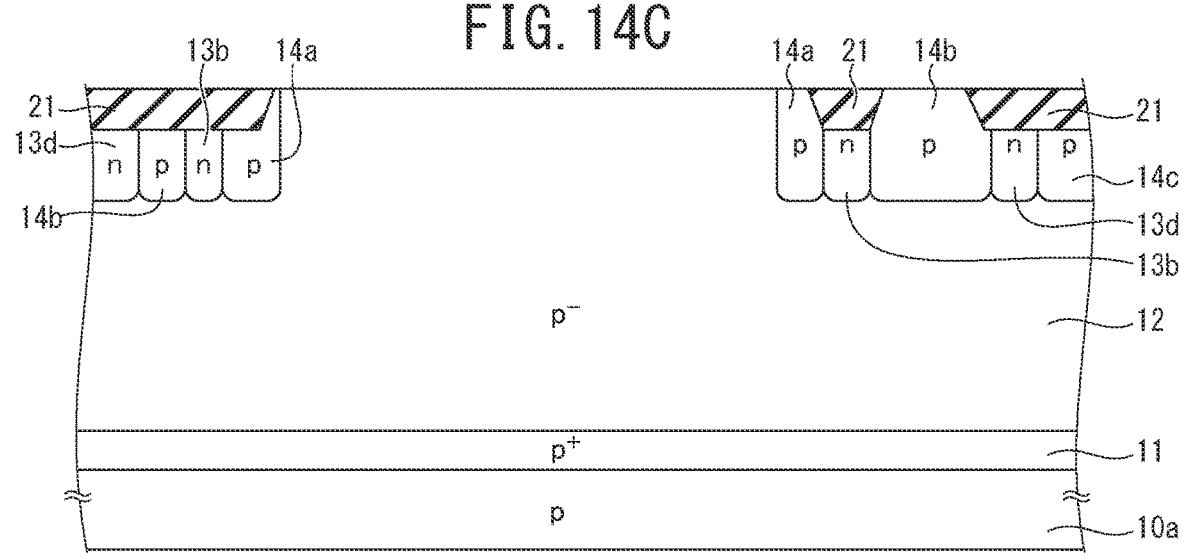

(b) Next, a structure body illustrated in FIG. 14 (a) is picked up from the reaction tube for epitaxial growth, and the structure body is introduced into an oxidation furnace. And, on the surface of the photoelectric conversion layer 12, an $SiO_2$ film of 0.6 to 1 micrometer is formed by a thermal oxidation method and the like. A photo resist film is coated on an upper surface of the $SiO_2$ film. Then, with a photolithography technique, the photo resist film is exposed and developed, thereby delineating a first implantation-mask to form the first n-tab 13b and the second n-tab 13d. From windows of the first implantation-mask, impurity ions for n-type doping such as phosphorus ions ($^{31}P^+$) and the like are implanted with multiple stages into the upper portion of the photoelectric conversion layer 12, while an acceleration energy is changed. After the removal of the first implantation-mask, a new photo resist film is coated on the upper surface of the $SiO_2$ film, and through the photolithography technique, the photo resist film is exposed and developed, thereby delineating a second implantation-mask to form the first p-well 14a, the second p-well 14b and the third p-well 14c. From windows of the second implantation-mask, impurity ions for p-type doping such as boron ions ($^{11}B^+$) are implanted with multiple stages into the upper portion of the photoelectric conversion layer 12 while the acceleration energy is changed.

(c) After the removal of the second implantation-mask, a thermal treatment is performed to selectively form the first n-tab 13b, the second n-tab 13d, the first p-well 14a, the second p-well 14b and the third p-well 14c on the upper portion of the photoelectric conversion layer 12, as illustrated in FIG. 14 (c). Since the ions are implanted at the multiple stages while the acceleration energy is changed, a lateral diffusion is suppressed, which can form a pattern having a large aspect ratio of a depth to pattern widths of the first n-tab 13b, the second n-tab 13d, the first p-well 14a, the second p-well 14b and the third p-well 14c. As the result, the structure of the injection-blocking element (13b and 13d) is formed in which as illustrated in FIG. 2, the periphery of the first p-well 14a is surrounded in the shape of wall by the first n-tab 13b, the first n-tab 13b is surrounded by the second p-well 14b, the periphery of the second p-well 14b is surrounded in the shape of wall by the second n-tab 13d, and the second n-tab 13d is surrounded by the third p-well 14c. Although illustration is omitted in FIG. 14 (c), at this time, the n-type sinker region 42, the p-well 43, the n-well 44 and the like are formed, as illustrated in FIG. 4. Moreover, as illustrated in FIG. 4, along the periphery of the semiconductor chip, the p-type tab-region 45 is also formed in the shape of ring.

(d) Next, on the surfaces of the photoelectric conversion layer 12, the first n-tab 13b, the second n-tab 13d, the first p-well 14a, the second p-well 14b and the third p-well 14c, $SiO_2$ film of 0.6 to 1 micrometer is formed by using the thermal oxidation method and the like. The $SiO_2$ film is delineated by the photolithography method, and etching mask is prepared for element isolation groove formation. Concretely, with photo resist film as mask, the $SiO_2$ film is etched by a reactive ion etching (RIE) method. After the etching, the photo resist film is removed, and with the $SiO_2$ film as mask, on the right side of FIG. 14 (c), the upper portions of the first n-tab 13b and the second n-tab 13d, and on the left side of FIG. 14 (c), the upper portions of the first n-tab 13b, the second n-tab 13d, the first p-well 14a, the second p-well 14b and the third p-well 14c are selectively etched by the RIE method, in accordance with a predetermined mask pattern, and element isolation grooves are accordingly formed at a depth of 0.5 micrometer to 1.5 micrometers. Next, by forming the element-isolation insulating-film 21, such as silicon oxide film and the like, at a film thickness thicker than the depth of the element isolation grooves, the element isolation grooves are buried in the upper portions of the first n-tab 13b and the second n-tab 13d on the right side of FIG. 14 (c), and buried in the upper portions of the first n-tab 13b, the second n-tab 13d, the first p-well 14a, the second p-well 14b and the third p-well 14c on the left side of FIG. 14 (c). Next, flattening process is performed by a chemical mechanical polishing (CMP) method and the like, and the structural cross-sectional view of FIG. 14 (c) is acquired.

(e) Moreover, a new photo resist film is coated on the top surface of the structure body illustrated in FIG. 14 (c), and through the photolithography technique, the new photo resist film is exposed and developed, thereby delineating a third implantation-mask to provide the surface-buried region 15. From windows of the third implantation-mask, phosphorus ions ($^{31}P^+$) are implanted into the upper portion of the photoelectric conversion layer 12. After the removal of the third implantation-mask, a fourth implantation-mask to provide the guide region 16 is delineated. From windows of the fourth implantation-mask, arsenic ions ($^{75}As^+$) are implanted into the upper portion of the surface-buried region 15. After the removal of the fourth implantation-mask, the structure body is annealed, thereby forming the surface-buried region 15 and the guide region 16 of the upper portion of the surface-buried region 15, as illustrated in FIG. 15 (d).

Figure 15D:
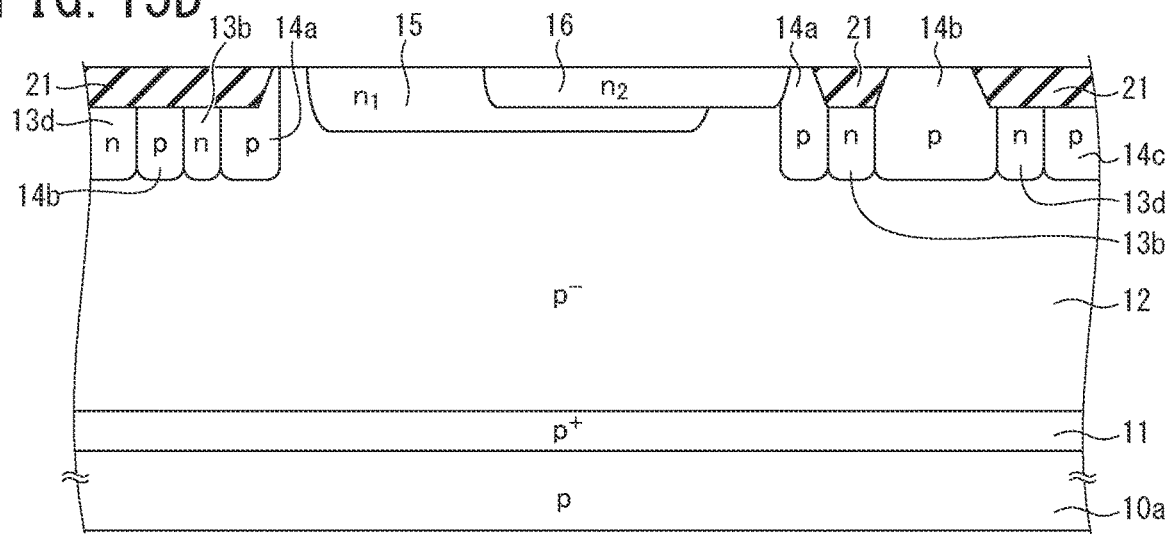
FIG. 15 illustrates schematic step cross-sectional views explaining a series of manufacturing steps pertaining to the manufacturing method of the solid-state imaging device, following the flow of the series of manufacturing steps illustrated in FIG. 14.
Figure 15E:
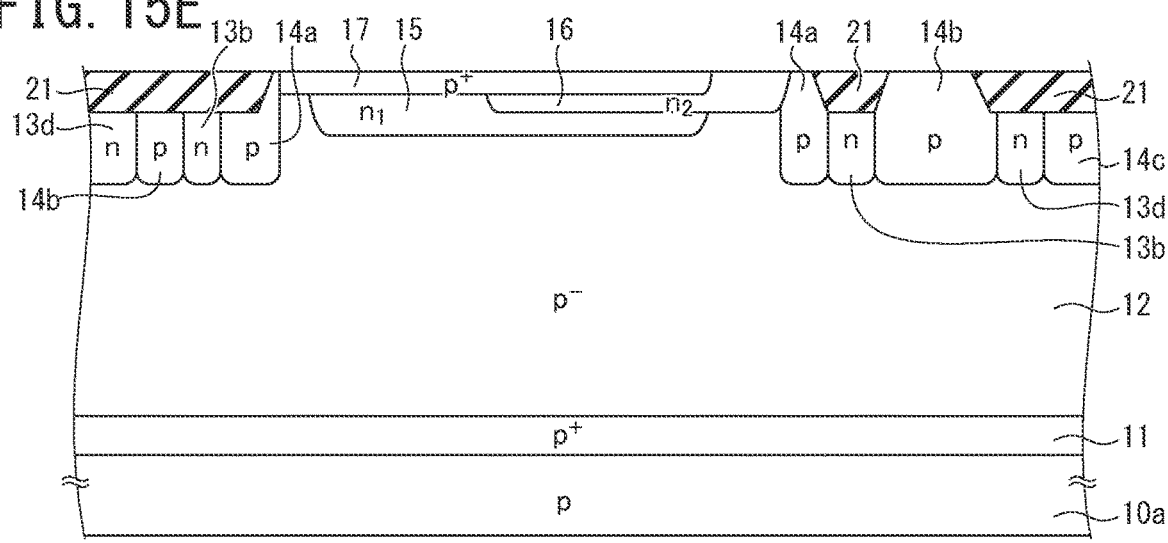
Figure 15F:
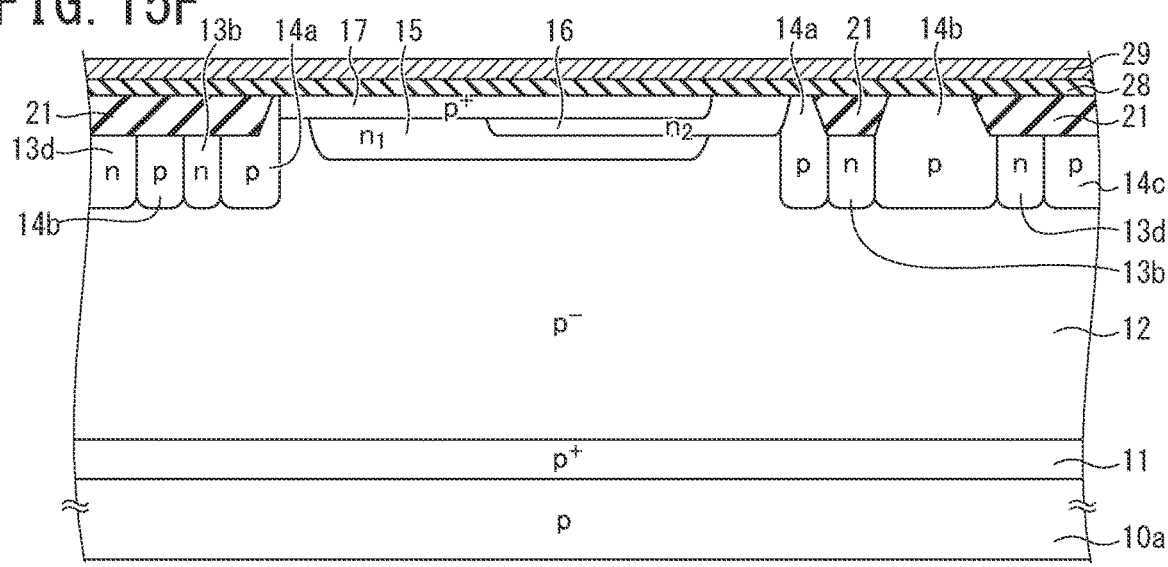

(f) Moreover, a new photo resist film is coated on the top surface of the structure body illustrated in FIG. 15 (d), and through the photolithography technique, the new photo resist film is exposed and developed, thereby delineating a fifth implantation-mask to provide the pinning layer 17. From windows of the fifth implantation-mask, boron ions ($^{11}B^+$) are implanted into the upper portions of the surface-buried region 15 and the guide region 16. Moreover, after the removal of the fifth implantation-mask, the structure body is annealed, and as illustrated in FIG. 15 (e), the pinning layer 17 whose impurity concentration is about $8 \times 10^{17}$ to $1.5 \times 10^{19}$ cm$^{-3}$ is selectively formed on the upper portions of the surface-buried region 15 and the guide region 16. The temperature and time of the annealing after the implantation of the boron ion are adjusted so that a depth of the pinning layer 17 becomes about 0.1 to 0.7 micrometer, preferably, about 0.2 to 0.5 micrometer.

(g) Next, the structure body illustrated in FIG. 15 (e) is taken out from the annealing furnace, and the structure body is put into an oxidation furnace. And, in the oxidation furnace, SiO$_2$ film for the gate insulating film 28 is laminated by a dry thermal oxidation method with a thickness of 30 nanometers to 80 nanometers on the entire surfaces of the pinning layer 17, the first p-well 14a, the second p-well 14b and the like. Moreover, a structure body in which the gate insulating film 28 has been laminated on the top surface is taken out from the oxidation furnace, and the structure body is put into a chemical vapor phase deposition (CVD) furnace. And, on the gate insulating film 28, the CVD method is used to deposit a phosphorous (P)-doped polycrystalline silicon (DOPOS) layer 29 of a thickness of 150 nanometers to 350 nanometers, as illustrated in FIG. 15 (f).

(h) Next, a new photo resist film is coated on the top surface of the structure body illustrated on FIG. 15 (f), and through the photolithograph technique, the new photo resist film is exposed and developed, thereby delineating a gate-electrode cutting-mask to define the electric-field control-electrodes 23$r_1$ and 23$r_2$. Concretely, with the photo resist film as mask, the DOPOS layer 29 is cut away by the RIE method and delineated, thereby forming the electric-field control-electrodes 23$r_1$ and 23$r_2$. At this time, the gate electrodes 71$q$ and 72$q$ of the reset transistor, the signal read-out transistor and the switching transistor which are exemplified in the right-lower portion in FIG. 2 are formed at the same time in the similar procedure. After the etching, the gate-electrode cutting-mask is removed, and a new photo resist film is coated, and through the photolithograph technique, the new photo resist film is exposed and developed, thereby delineating a sixth implantation-mask having windows to open the peripheries of the gate electrodes 71$q$ and 72$q$, in order to prepare the source and drain electrodes of the reset transistor, the signal read-out transistor and the switching transistor.

(i) By the windows of the sixth implantation-mask, with the gate electrodes 71$q$ and 72$q$ as self-alignment masks, impurity ions for n-type doping such as arsenic ions ($^{75}As^+$) and the like are implanted into the upper portions of the first p-well 14 and the second p-well 14b. Although illustration is omitted in FIG. 14 (b), at this time, the n-type impurity ions are implanted into the n-type sinker region 42, the p-well 43 and the n-well 44 illustrated in FIG. 4, and a part of the implantations is accompanied by the self-alignment scheme.

(j) Moreover, after the removal of the photo resist film as the sixth implantation-mask, another photo resist film is coated, and through the photolithograph technique, a seventh implantation-mask having windows to open a part of the upper portions of the second p-well 14b, the p-well 43, the n-well 44 and the p-type tab-region 45 is provided in another photo resist film. By the seventh implantation-mask, impurity ions for p-type doping such as boron ions ($^{11}B^+$) are implanted into a part of the upper portions of the second p-well 14b, the p-well 43, the n-well 44 and the p-type tab-region 45, and a part of them are executed by the self-alignment scheme.

(k) And after the removal of the seventh implantation-mask, by annealing the structure body, the charge-accumulation region 18 whose impurity concentration is about $5 \times 10^{19}$ to $1 \times 10^{21}$ cm$^{-3}$ is provided on the upper portion of the first p-well 14b, and source/drain regions 91$q$, 92$q$ and 93$q$ of an intra-pixel circuit-element whose impurity concentration are about $5 \times 10^{19}$ to $1 \times 10^{21}$ cm$^{-3}$ are arranged on the upper portion of the second p-well 14b. Moreover, the source region 64, drain region 65 and p-well contact region 63 in the p-well 43 illustrated in FIG. 4, and the source region 66, drain region 67 and n-well contact region 68 in the n-well 44, and further, the sinker contact region 62 in the sinker region 42 are provided at the same time by the annealing after the ion implantation.

(l) And, the inter-layer insulating film 22 is deposited so as to cover the entire surface that includes the electric-field control-electrodes 23$r_1$ and 23$r_2$ and the gate electrodes 71$q$ and 72$q$ in the intra-pixel circuit, as illustrated in FIG. 3. As the inter-layer insulating film 22, it is possible to employ non-doped SiO$_2$ film referred to as "NSG", which does not include impurity elements such as phosphorus (P) or boron (B) atoms. By the way, as the inter-layer insulating film 22, phospho-silicate glass (PSG) film to which phosphorus atoms are doped, boro-silicate glass (BSG) film to which boron atoms are doped, boro-phospho-silicate glass (BPSG) film to which boron and phosphorus atoms are doped, or silicon nitride (Si$_3$N$_4$) film and the like can be used. As necessary, the upper surface of the inter-layer insulating film 22 may be flattened by the CMP method and the like. After that, by a usual metallization technique, necessary surface interconnections are interconnected through contact vias 71qc and 72qc opened in the inter-layer insulating film 22. By the way, surface interconnections are delineated on even the source/drain regions of peripheral circuits other than the intra-pixel circuit-elements, such as the signal read-out transistor and the switching transistor, by the similar procedure. After repeating predetermined multiple times of the deposition steps of the inter-layer insulating film and metallization steps on the inter-layer insulating film so as to establish the actual surface interconnections, which is implemented by multi-level interconnection architecture, the solid-state imaging device pertaining to the embodiment is completed.

As mentioned above, according to the manufacturing method of the solid-state imaging device pertaining to the embodiment of the present invention, the intra-pixel structure including the injection-blocking element (13b and 13d) in which as illustrated in FIG. 2, the first p-well 14a is surrounded in the shape of wall by the first n-tab 13b, the first n-tab 13b is surrounded by the second p-well 14b, the second p-well 14b is surrounded in the shape of wall by the second n-tab 13d, and the second n-tab 13d is surrounded by the third p-well 14c can be achieved at high manufacturing yield by a standard manufacturing process of conventional CMOS. Since the standard manufacturing process can be used, according to the manufacturing method of the solid-state imaging device pertaining to the embodiment of the present invention, the structure of the pixel in which the signal charges can be transported at a high speed, and the injection-blocking element (13b and 13d) for blocking the injection of the holes, serving as the non-signal charges, is easily manufactured. And, according to the manufacturing method of the solid-state imaging device pertaining to the embodiment, the solid-state imaging device in which the increase in power dissipation is suppressed can be manufactured easily at high manufacturing yield.

First Modification of Embodiment

Figure 16:
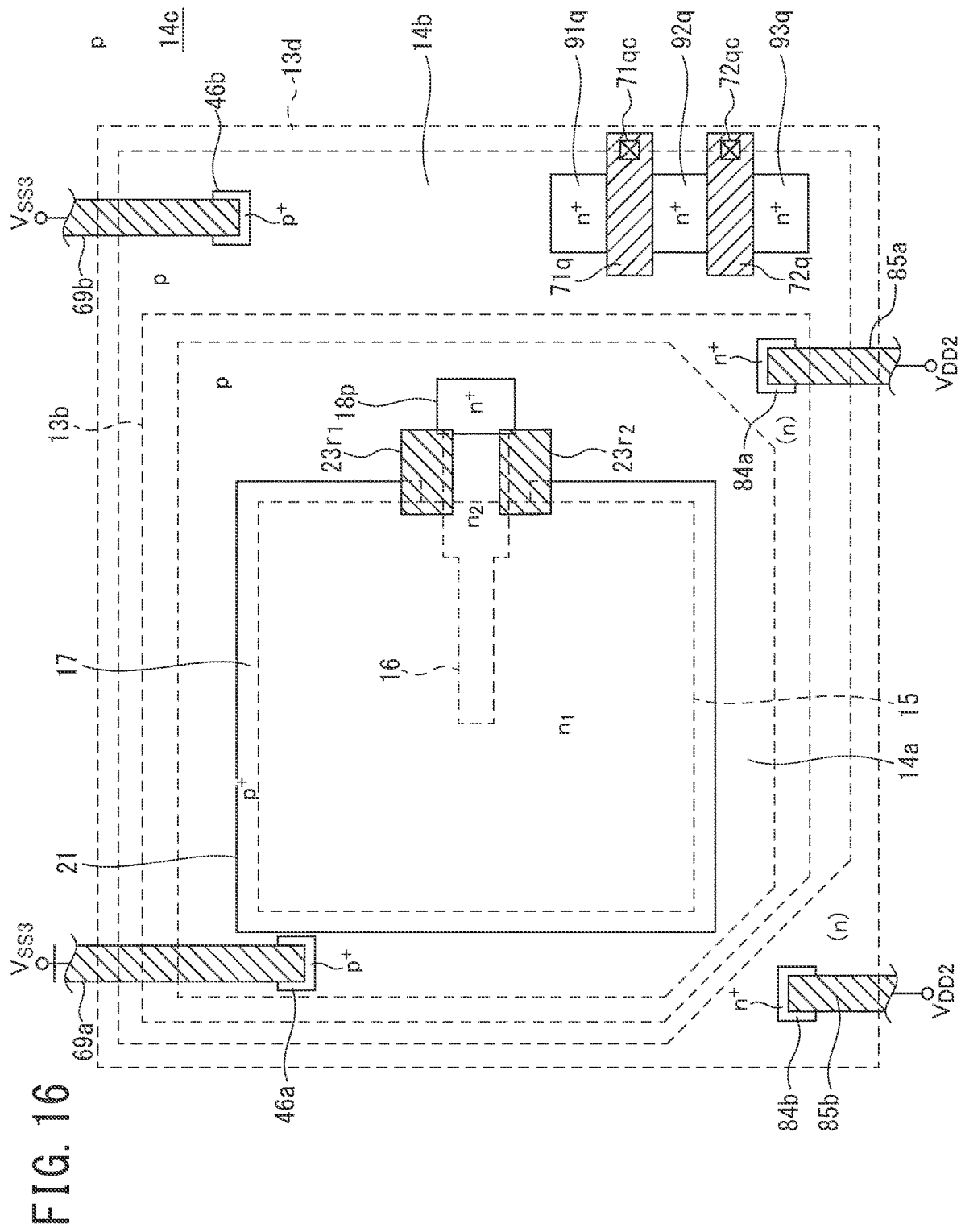
FIG. 16 is a schematic plan view illustrating an outline of a planar structure of a pixel of a solid-state imaging device pertaining to a first modification of the embodiment is viewed from above by omitting, or seeing through an inter-layer insulating film, as one example.

FIG. 16 illustrates one example of a planar structure of a pixel in a solid-state imaging device pertaining to the first modification of the embodiment of the present invention. In the center and left side of a planar pattern in FIG. 16, a surface-buried region 15 serving as a light-receiving cathode-region (charge-generation region) is illustrated as a rectangular area. Similarly to the case of the plan view in FIG. 2, since the inter-layer insulating film 22 illustrated in FIG. 3 is omitted in FIG. 16, so that the underlying planar pattern can be easy recognized. Similarly to the planar structure illustrated in FIG. 2, the surface-buried region 15 is surrounded by a first p-well 14a, the area of the first p-well 14a is surrounded by a wall-shaped first n-tab 13b, the first n-tab 13b is surrounded by a second p-well 14b, the second p-well 14b is surrounded by a wall-shaped second n-tab 13d, the second n-tab 13d is surrounded by a third p-well 14c, and an injection-blocking element (13b and 13d) is accordingly implemented. Similarly to the structure exemplified in FIG. 2, in the planar pattern in FIG. 16, the signal charges are transported via a guide region 16 to the charge-accumulation region 18p, the control of the transport of the signal charges is executed by the lateral electric fields induced by electric-field control-electrodes $23r_1$ and $23r_2$ through the static induction effect.

A structure in which the lower-potential power-supply voltage $V_{SS3}$ is applied through a surface interconnection 69a to a p-well contact region 46a formed in the first p-well 14a, and the lower-potential power-supply voltage $V_{SS3}$ is applied through a surface interconnection 69b to a p-well contact region 46b of the second p-well 14b is similar to the structure exemplified in FIG. 2. However, as illustrated in FIG. 16, a structure in which an n-tab contact region 84a is provided in the first n-tab 13b, a higher-potential power-supply voltage $V_{DD2}$ is applied through a surface interconnection 85a to the n-tab contact region 84a, and an n-tab contact region 84b is provided in the second n-tab 13d, and the higher-potential power-supply voltage $V_{DD2}$ is applied through a surface interconnection 85b to the n-tab contact region 84b differs from the structure exemplified in FIG. 2.

Although illustration of a cross-sectional view is omitted, similarly to the structure illustrated in FIG. 3, even in the pixel $X_{ij}$ of the solid-state imaging device pertaining to the first modification of the embodiment, the depletion-layer extension-promotion region (10a and 11) is constructed by the p-type semiconductor substrate 10a and the $p^+$ type bottom-side bias-layer 11 arranged on the semiconductor substrate 10a. Then, technical features, actions and effectiveness, which are ascribable to the technical features, are as already explained in the solid-state imaging device pertaining to the embodiment, and the duplicate description is omitted. However, according to the intra-pixel structure of the pixel of the solid-state imaging device in the first modification of the embodiment, a potential profile ascribable to the injection-blocking element (13b and 13d), which includes the first n-tab 13b and the second n-tab 13d, does not disturb the gradient of the potentials generated in the guide region 16. Thus, the signal charges can be transported at a higher speed, and it is possible to avoid the increase in power dissipation due to the injection of the non-signal charges, or holes.

Second Modification of Embodiment

Figure 17:
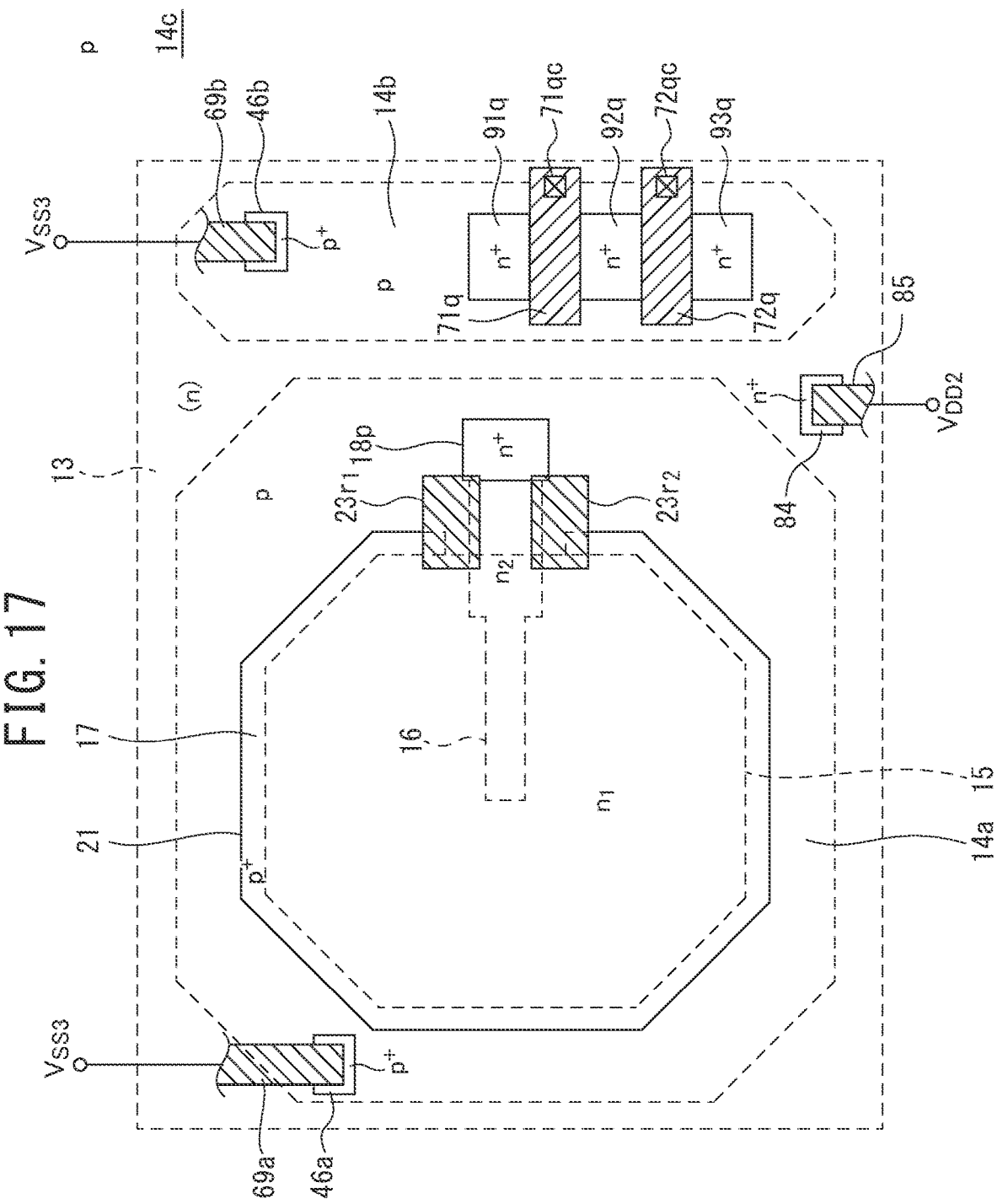
FIG. 17 is a schematic plan view illustrating an outline of a planar structure of a pixel of a solid-state imaging device pertaining to a second modification of the embodiment is viewed from above by omitting, or seeing through the inter-layer insulating film, as one example.

FIG. 17 illustrates one example of a planar structure of a pixel in a solid-state imaging device pertaining to the second modification of the embodiment of the present invention. In the center and left side of the planar pattern in FIG. 17, a surface-buried region 15 serving as a light-receiving cathode-region (charge-generation region) is illustrated as an octagonal area. Different from the planar structure illustrated in FIG. 2, a part of a wall-shaped first n-tab 13b and the corresponding part of a wall-shaped second n-tab 13d in FIG. 2 are merged to implement a common n-type tab-region (common n-tab) 13, and with the topology such that the common n-tab 13 has two octagonal windows in a planar pattern, the structure illustrated in FIG. 17 can implement an injection-blocking element for blocking the injection of the non-signal charges, or holes.

In FIG. 17, a first p-well 14a is assigned in the left window of the wall-shaped common n-tab 13, and a second p-well 14b is assigned in the right window of the common n-tab 13. And, the surface-buried region 15 is allocated in the left window of the common n-tab 13 so as to be surrounded by the first p-well 14a. Furthermore, the outside of the common n-tab 13 is surrounded by a third p-well 14c. Although the illustration of the cross-sectional view corresponding to FIG. 17 is omitted, the structure in which a well region 14 is divided into three wells of the first p-well 14a, the second p-well 14b and the third p-well 14c can be understood by the analogy of the right side of the cross-sectional view in FIG. 3. In FIG. 3, at least at a part of the well region 14, the well region 14 is divided into three wells of the first p-well 14a, the second p-well 14b and the third p-well 14c.

That is, as long as the planar pattern in FIG. 17 is concerned in a localized narrow area corresponding to the right-side region of the cross-sectional view in FIG. 3, the three wells of the first p-well 14a, the second p-well 14b and the third p-well 14c are provided with aide of a part of the common n-tab 13 allocated at the left side and another part of the common n-tab 13 allocated at the right side, such that the part of the common n-tab 13 allocated at the left side and the another part of the common n-tab 13 allocated at the right side implements a structure of the double tab-regions. It is obvious that the structure implemented by the common n-tab 13, represented by the planar pattern in FIG. 17, differ from the structure illustrated in FIG. 3, in a narrow vision on the left-side region of the cross-sectional view in FIG. 3.

Similarly to the structures exemplified in FIGS. 2 and 16, even in the planar pattern in FIG. 17, due to the static induction effect by the lateral electric fields induced by the electric-field control-electrodes $23r_1$ and $23r_2$, the signal charges transported through the guide region 16 are controlled so as to be transferred to the charge-accumulation region 18p at a high speed. By the way, similarly to the case of the plan view in FIG. 2, the inter-layer insulating film 22 illustrated in the cross-sectional structure illustrated in FIG. 3 is omitted in FIG. 17 so that the underlying planar pattern can be easy recognized.

A structure in which the lower-potential power-supply voltage $V_{SS3}$ is applied through a surface interconnection 69a to a p-well contact region 46a formed in the first p-well 14a, and the lower-potential power-supply voltage $V_{SS3}$ is applied through a surface interconnection 69b to a p-well contact region 46b of the second p-well 14b is similar to the structure exemplified in FIG. 2. However, as illustrated in FIG. 17, a structure in which an n-tab contact region 84 is provided in the wall-shaped common n-tab 13b, and the higher-potential power-supply voltage $V_{DD2}$ is applied through a surface interconnection 85 to the n-tab contact region 84 differs from the structure exemplified in FIG. 16.

Although illustration of a cross-sectional view is omitted, similarly to the structure illustrated in FIG. 3, even in the pixel $X_{ij}$ of the solid-state imaging device pertaining to the second modification of the embodiment, the depletion-layer extension-promotion region (10a and 11) is constructed by the p-type semiconductor substrate 10a and the p$^+$ type bottom-side bias-layer 11, which is provided on the semiconductor substrate 10a and is higher in impurity concentration than the semiconductor substrate 10a. Then, technical features, actions and effectiveness, which are ascribable to the technical features, are the same as already explained in the solid-state imaging device pertaining to the embodiment, and the duplicate description is omitted.

Figure 18:
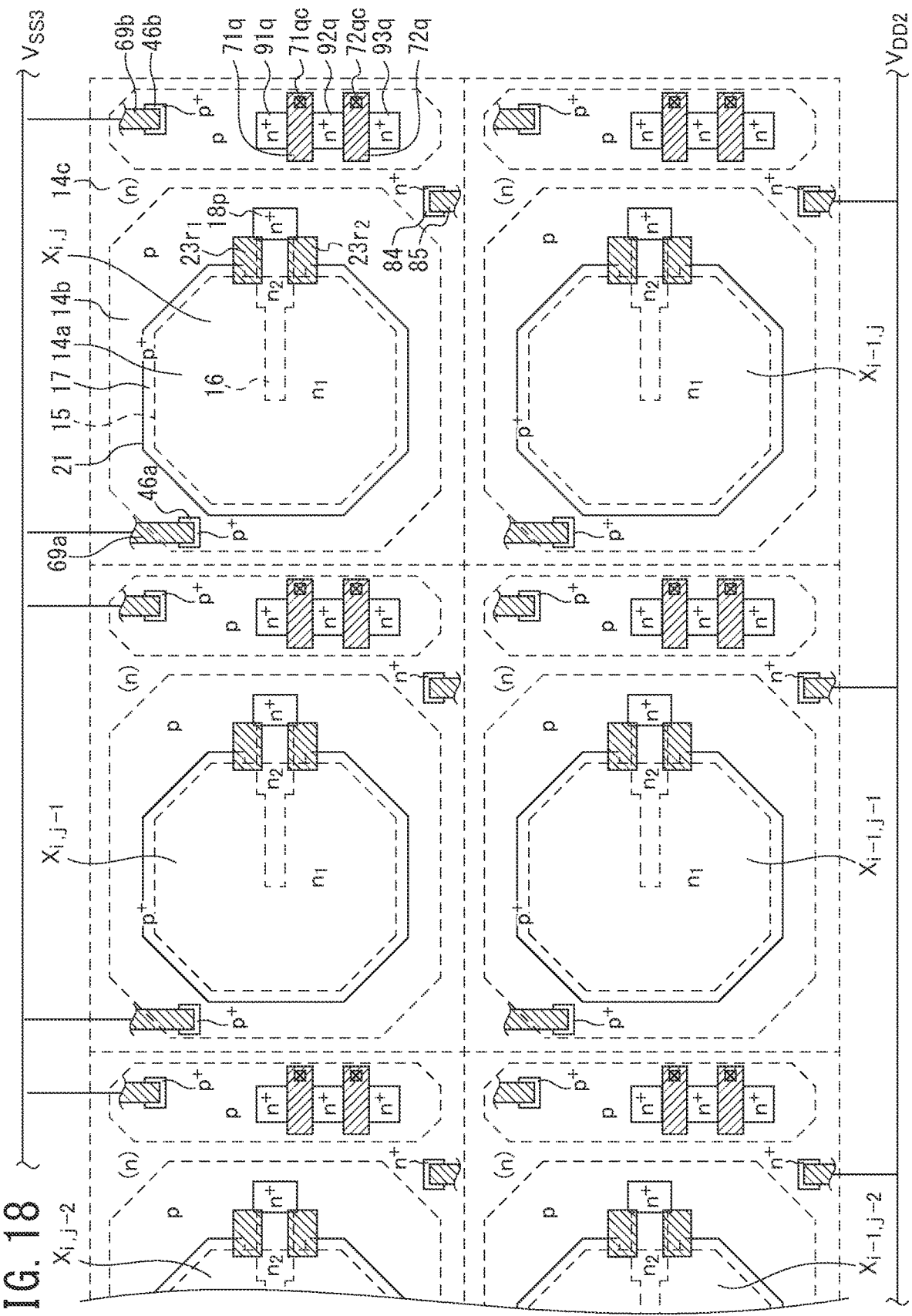
FIG. 18 is a plan view illustrating a matrix configuration of 2×3, which serves as a part of a structure in which pixels illustrated in FIG. 17 are arrayed in a shape of matrix.

FIG. 18 illustrates a matrix configuration $X_{i,j-2}$, $X_{i,j-1}$, $X_{i,j}$; $X_{i+1,j-2}$, $X_{i+1,j-1}$, $X_{i+1,j}$ of 2×3, representing a part of a structure in which the pixels $X_{ij}$ illustrated in FIG. 17 are arrayed in a shape of matrix. It is understood that the portion of the third p-well 14c implements a pixel isolation region of the matrix of 2×3. According to the solid-state imaging device pertaining to the second modification of the embodiment, a potential profile ascribable to the injection-blocking element (13) including the wall-shaped common n-tab 13 does not disturb the gradient of the potentials generated in the guide region 16. Since the potential gradient in the guide region 16 is not disturbed, according to the pixel $X_{ij}$ of the solid-state imaging device pertaining to the second modification of the embodiment of the present invention, because an object that the signal charges can be transported at a higher speed is compatible to another object addressing to the decrease of power dissipation due to the injection of the holes, both objects can be achieved simultaneously, by generating the potential barrier against the non-signal charges, or holes with the injection-blocking element.

Third Modification of Embodiment

The embodiment illustrated in FIG. 2 explains a case that a pair of electric-field control-electrodes $23r_1$ and $23r_2$ are arranged on both sides of the guide region 16 and due to the static induction effect by the lateral electric fields induced by the electric-field control-electrodes $23r_1$ and $23r_2$, the potential in the guide region 16 is controlled and the signal charges are transferred to the charge-accumulation region 18p. However, even if the electric-field control-electrode exists on only one side, the transfer of the signal charges in the channel area, passing through the side edge of the electric-field control-electrode, can be controlled by changing the potential profile in the lateral electric field along one direction induced by a single electric-field control-electrode.

Figure 19:
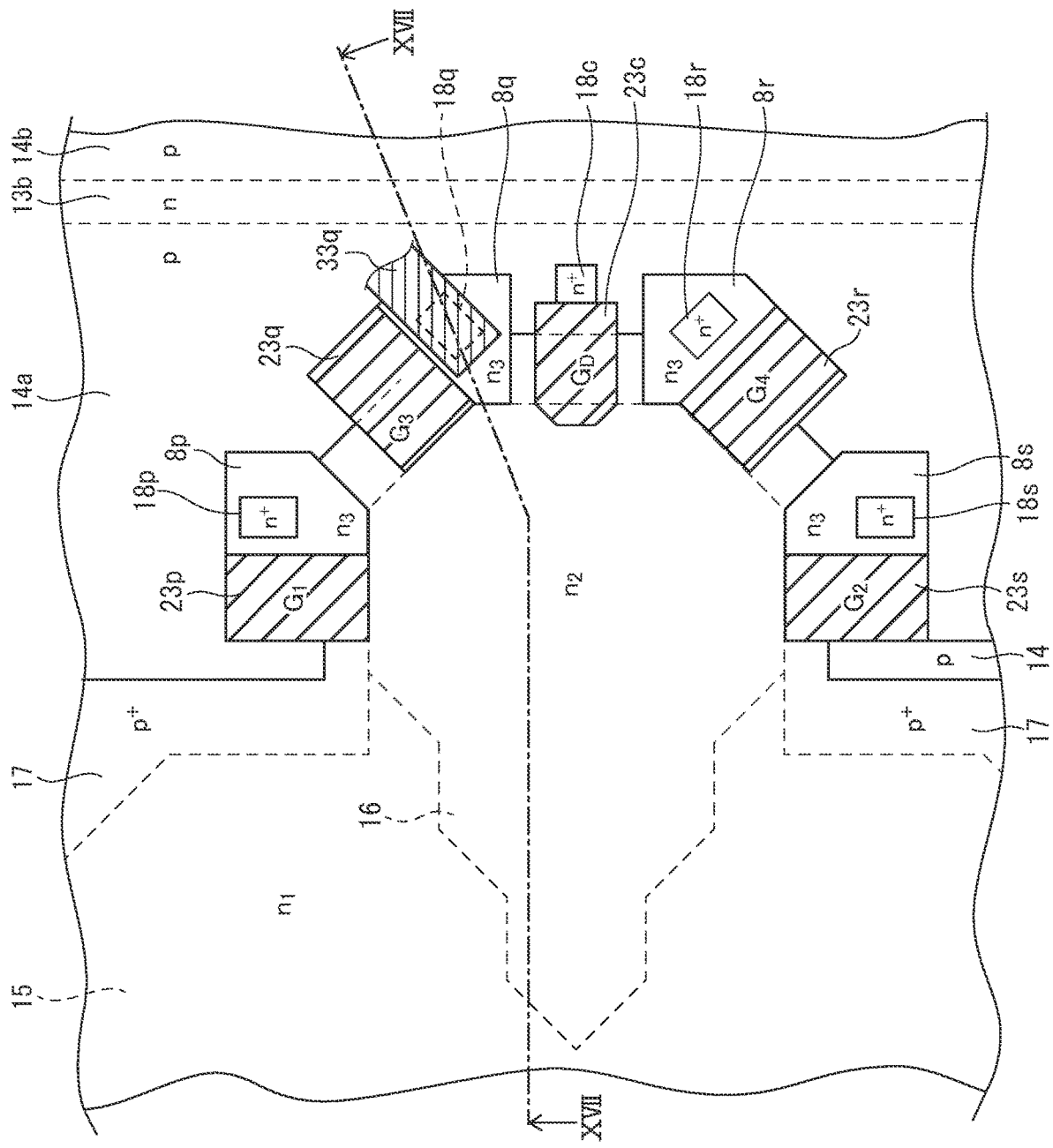
FIG. 19 is a schematic plan view illustrating an outline of a planar structure of a pixel in a TOF solid-state imaging device pertaining to a third modification of the embodiment, which is viewed from above by omitting, or seeing through the inter-layer insulating film, as one example.
Figure 20:
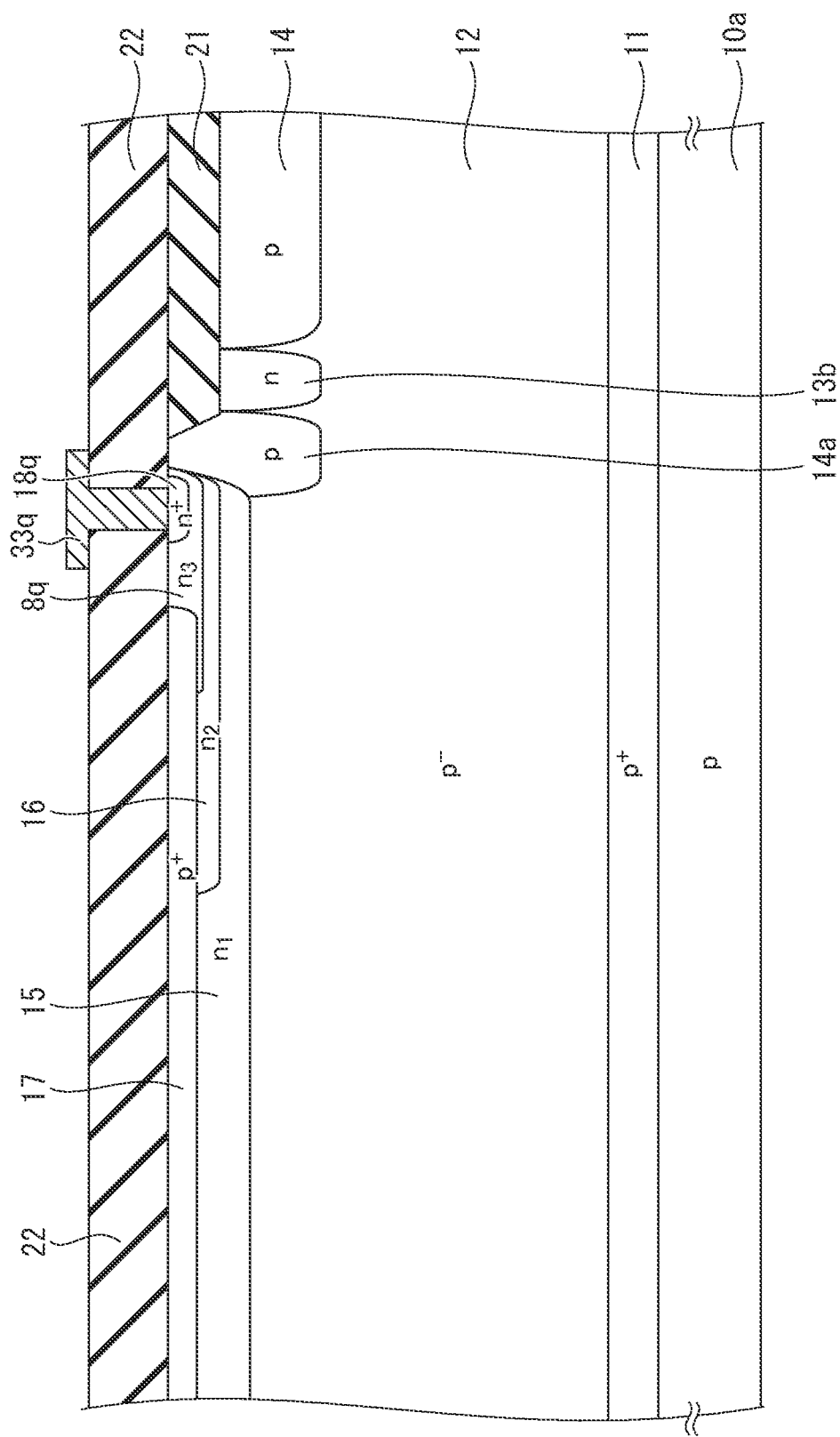
FIG. 20 is a cross-sectional view of the pixel of the TOF solid-state imaging device pertaining to the third modification of the embodiment, taken along a XVII-XVII direction of the plan view of the pixel illustrated in FIG. 19.

FIG. 19 illustrates an enlarged view of one example of a layout of a planar structure of a pixel $X_{ij}$ of a TOF solid-state imaging device pertaining to the third modification of the embodiment of the present invention. And FIG. 20 illustrates a cross-sectional view corresponding to FIG. 19. Because the planar pattern illustrated in FIG. 19 is a view that partially illustrates the right side from the center of the area occupied by the pixel $X_{ij}$, FIG. 19 illustrates the right-side region from the center of an n-type surface-buried region 15 having an impurity concentration $n_1$. The n-type surface-buried region 15 serves as a light-receiving cathode-region (charge-generation region). In FIG. 19, the area of a first n-tab 13b is indicated on the right side of a first p-well 14a, and the area of a second p-well 14b is indicated on the right side of the first n-tab 13b. Even in the planar structure of the pixel $X_{ij}$ of the TOF solid-state imaging device pertaining to the third modification of the embodiment, the first p-well 14a is surrounded in the shape of wall by the first n-tab 13b, the first n-tab 13b is surrounded by the second p-well 14b, the second p-well 14b is surrounded in the shape of wall by the second n-tab, and the second n-tab is surrounded by the third p-well.

A scheme of generating potential barrier just under the first p-well 14a and the second p-well 14b so as to provide an injection-blocking element for blocking the injection of the holes, or the non-signal charges, is similar to the scheme of the embodiment. FIG. 20 illustrates a cross-sectional structure taken from an XVII-XVII direction of the pixel $X_{ij}$ illustrated in FIG. 19. By the way, the interlayer insulating film 22 illustrated in FIG. 20 is omitted in the representation in FIG. 19 so that the under-lying planar pattern can be easy recognized. The surface-buried region 15 is similar to the structure illustrated in FIGS. 2 and 3 with regard to the topology such that the n-type surface-buried region 15 is surrounded by the first p-well 14a.

The TOF pixel $X_{ij}$ illustrated in FIG. 19 receives an optical signal entered through an opening in a light shield film. That is, a photodiode is constructed by the surface-buried region 15, which is surrounded by the first p-well 14a and services as the light-receiving cathode-region, and the photoelectric conversion layer 12 serving as a light-receiving anode-region just under the surface-buried region 15. An n-type guide region 16 having a "stepped gourd-shape", or a convex polygon having a contour of gourd-shape as the envelope curve, is provided on the surface-buried region 15, such that the n-type guide region 16 is provided on the right side in the surface-buried region 15. The n-type guide region 16 has an impurity concentration $n_2$ ($n_1 < n_2$), and the pattern of the stepped gourd-shape spreads out toward the right end so that the pattern extends to the right side from the center of the surface-buried region 15. The signal charges (electrons) generated in the photoelectric conversion layer 12 are injected into a part of the surface-buried region 15 just above the photoelectric conversion layer 12, and the signal charges are guided to the guide region 16 having the pattern spreading out wider and wider toward the right end.

Four electric-field control-electrodes 23p, 23q, 23r and 23s are allocated in a shape of fan on the right side of the guide region 16. Four n-type channel areas 8p, 8q, 8r and 8s, which have a higher impurity concentration $n_3$ than the impurity concentration $n_2$ of the guide region 16 ($n_3 > n_2$), respectively, are arranged immediately adjacent to the electric-field control-electrodes 23p, 23q, 23r and 23s, respectively, when they are viewed as the planar pattern. After the signal charges generated by the pixel $X_{ij}$ are guided to four directions in the guide region 16, potentials of the channel areas 8p, 8q, 8r and 8s are controlled sequentially by the static induction effects by the lateral electric field controls of the electric-field control-electrodes 23p, 23q, 23r and 23s, and the signal charges are transferred sequentially through the channel areas 8p, 8q, 8r and 8s.

Concretely, charge transfer channels are induced on the surfaces of the channel areas 8p, 8q, 8r and 8s immediately adjacent to the electric-field control-electrodes 23p, 23q, 23r and 23s by voltages that are sequentially applied to the electric-field control-electrodes 23p, 23q, 23r and 23s, and the signal charges transported through the guide region 16 are transferred sequentially. Moreover, as illustrated in FIG. 19, four $n^+$ type charge-accumulation regions 18p, 18q, 18r and 18s are arranged as floating drain regions on the right side in the channel areas 8p, 8q, 8r and 8s, respectively, so that the signal charges transferred by the electric-field control-electrodes 23p, 23q, 23r and 23s can be accumulated in the charge-accumulation regions 18p, 18q, 18r and 18s.

In the planar pattern of the fan-shaped array, an exhaust-gate electrode 23c is provided between the upper arrangement of two electric-field control-electrodes 23p and 23q and the lower arrangement of two electric-field control-electrodes 23r and 23s in FIG. 19. And an $n^+$ type exhaust-drain region 18c is provided on the right side of the exhaust-gate electrode 23c. In FIG. 20, the charge-accumulation region 18q is exposed in the cross-sectional view taken along the XVII-XVII direction in the pixel $X_{ij}$ illustrated in FIG. 19. A surface interconnection 33q is connected to the charge-accumulation region 18q. The exhaust-gate electrode 23c illustrated in FIG. 19 draws out charges ascribable to dark current, background light and the like, to the exhaust-drain region 18c, at a predetermined timing with respect to the electric-field control-electrodes 23p, 23q, 23r and 23s.

The illustrations of the gate electrodes for the group of MOS transistors implementing the intra-pixel circuit-elements and the like are omitted, because the positions of the gate electrodes are lying outside the paper surface of FIG. 19, although the positions of the gate electrodes implementing the intra-pixel circuit-elements shall be assigned on the further right side of the charge-accumulation regions 18p, 18q, 18r and 18s and the exhaust-gate electrode 23c, if we compare with the layout of the intra-pixel circuit-elements illustrated in FIG. 2. In addition, although the source and drain electrodes and the like in the MOS transistors shall be arranged with the topology such that the gate electrodes are sandwiched in between the source and drain electrodes, the illustration of the source and drain electrodes is also omitted.

As illustrated in FIG. 20, a structure of each of the pixels $X_{ij}$ in the solid-state imaging device pertaining to the third modification of the embodiment is similar to the structure illustrated in FIG. 3, in that the pixels $X_{ij}$ has a depletion-layer extension-promotion region (10a and 11), which has a p-type semiconductor substrate 10a and a $p^+$ type bottom-side bias-layer 11 provided on the semiconductor substrate 10a, wherein the impurity concentration of the $p^+$ type bottom-side bias-layer 11 is higher than the semiconductor substrate 10a. And, a p- type photoelectric conversion layer 12 having a lower impurity concentration than the semiconductor substrate 10a is provided on the bottom-side bias-layer 11, the semiconductor substrate 10a implements the upper layer of the depletion-layer extension-promotion region (10a and 11), and an n-type surface-buried region 15 is provided on the photoelectric conversion layer 12.

As can be understood from FIG. 19, the guide region 16 is provided in the center on the right side of the surface-buried region 15 as a pattern spreading out wider and wider toward the right end, and implements a path in which the transport of the signal charges is accelerated by the potential gradient due to the wider-and-wider spreading topology. A $p^+$ type pinning layer 17 that is higher in impurity concentration than the first p-well 14a and the second p-well 14b is provided on the surface-buried region 15, and the guide region 16 is sandwiched in between the pinning layer 17 and the surface-buried region 15.

Even in the design of the solid-state imaging device pertaining to the third modification of the embodiment, the p-type tab-region 45 is scheduled to be provided along the periphery of the semiconductor chip, similarly to the structure illustrated in FIG. 4, and the $p^+$ type tab contact region 61 is buried in the tab-region 45. Since the power supply voltage $V_{SS2}$ of negative potential value is applied to the tab contact region 61, the depletion layer $12_{dep}$ extends in the photoelectric conversion layer 12, similarly to the case illustrated in FIG. 4.

According to the structure of the pixel $X_{ij}$ in the solid-state imaging device pertaining to the third modification of the embodiment, since the depletion layer $12_{dep}$ extends in the whole of the photoelectric conversion layer 12, the signal charges are transported at high-speed. Thus, it is possible to achieve the TOF type sensor of high-speed operation below nanosecond. Moreover, in the structure of the pixel $X_{ij}$ in the solid-state imaging device pertaining to the third modification of the embodiment, the structure in which the first p-well 14a is surrounded by the first n-tab 13b, the first n-tab 13b is surrounded by the second p-well 14b, the second p-well 14b is surrounded by the second n-tab, and the second n-tab is surrounded by the third p-well implements the injection-blocking element for blocking the injection of the holes, or the non-signal charges. Thus, it is possible to avoid the increase in power dissipation of the TOF type sensor, which is caused by the injection of the holes from the first p-well 14a and the second p-well 14b.

Other Embodiment

As mentioned above, the present invention is described by the embodiment. However, the descriptions and drawings implementing a part of the disclosure should not be construed to limit the invention. From the disclosure, various variations, examples and operational techniques may be clear for one skilled in the art.

Figure 21:
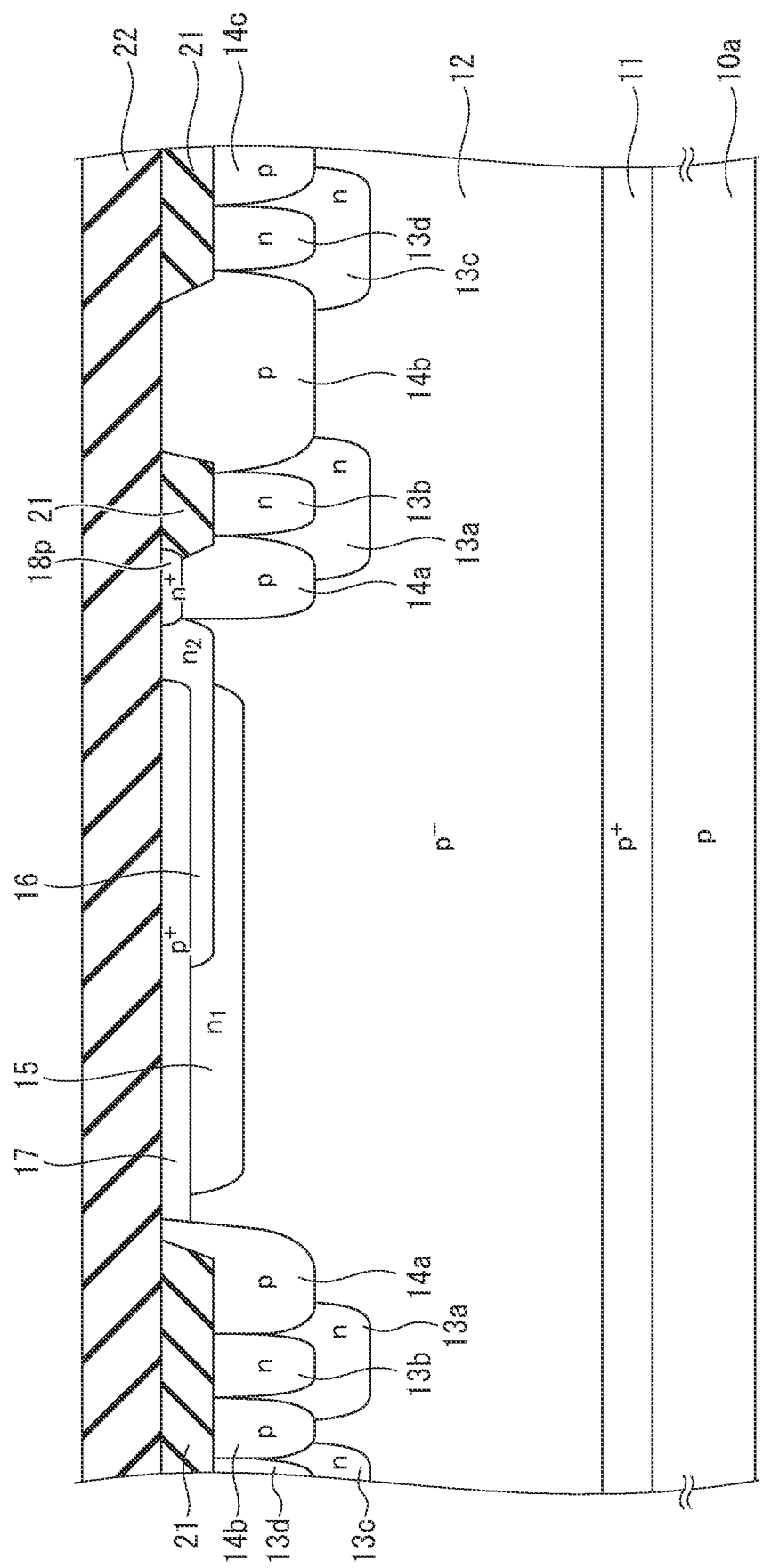
FIG. 21 is another schematic cross-sectional view illustrating an outline of a cross-section structure of a pixel in a solid-state imaging device pertaining to another embodiment, as one example (example No. 1)

For example, a structure illustrated in FIG. 21 is similar to the topology of FIG. 3 in that a first p-well 14a is surrounded by a first n-tab 13b, the first n-tab 13b is surrounded by a second p-well 14b, the second p-well 14b is surrounded by a second n-tab 13d, and the second n-tab 13d is surrounded by a third p-well 14c. However, in the structure of the pixel in the solid-state imaging device pertaining to the other embodiments of the present invention illustrated in FIG. 21, the feature such that a lower surface of the first n-tab 13b is covered by an n-type first shield region 13a, and a lower surface of the second n-tab 13d is covered by an n-type second shield region 13c differs from the structure illustrated in FIG. 3. The first shield region 13a covers a lower surface of the first n-tab 13b, including a part of the lower surface of the second p-well 14b from a part of the lower surface of the first p-well 14a. Also, the second shield region 13c covers the lower surface of the second n-tab 13d, including a part of the lower surface of the third p-well 14c from a part of the lower surface of the second p-well 14b.

As illustrated in FIG. 21, since the first shield region 13a and the second shield region 13c are incorporated, a much higher potential barrier for blocking the injection of the holes can be generated just under the first p-well 14a and the second p-well 14b, it is possible to suppress the increase in power dissipation due to the injection of the holes. Because the potential profile achieved by the injection-blocking element (13a, 13b, 13c and 13d) that includes the first shield region 13a and the second shield region 13c does not disturb the gradient of the potentials generated in the guide region 16, the structure of the pixel $X_{ij}$ of the solid-state imaging device pertaining to the other embodiment illustrated in FIG. 21 facilitates the high-speed charge-transport in which the transport of the signal charges is accelerated by the potential gradient.

Figure 22:
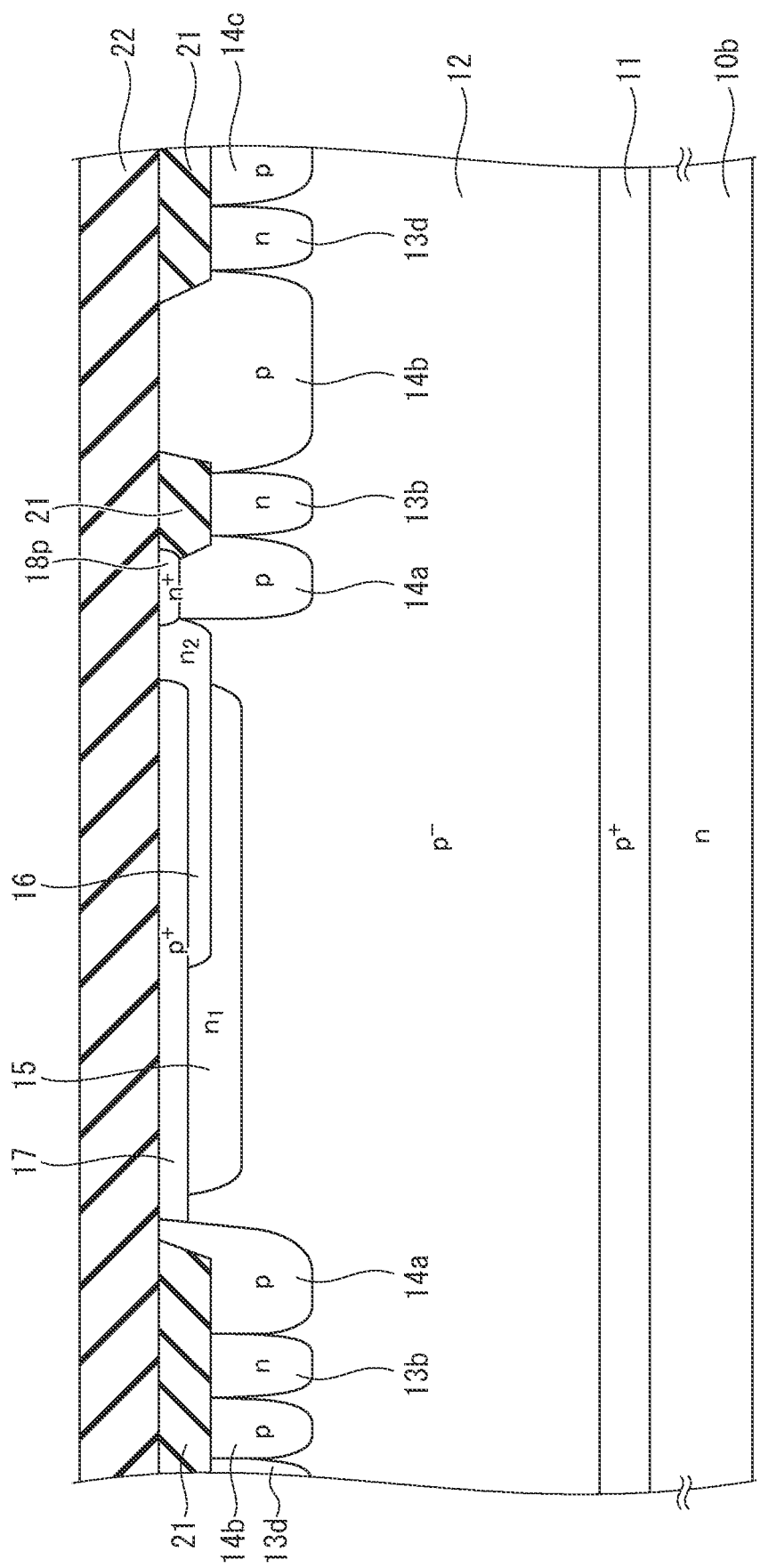
FIG. 22 is a still another schematic cross-sectional view illustrating an outline of a cross-section structure of a pixel in a solid-state imaging device pertaining to a still another embodiment, as one example (example No. 2)
Figure 23:
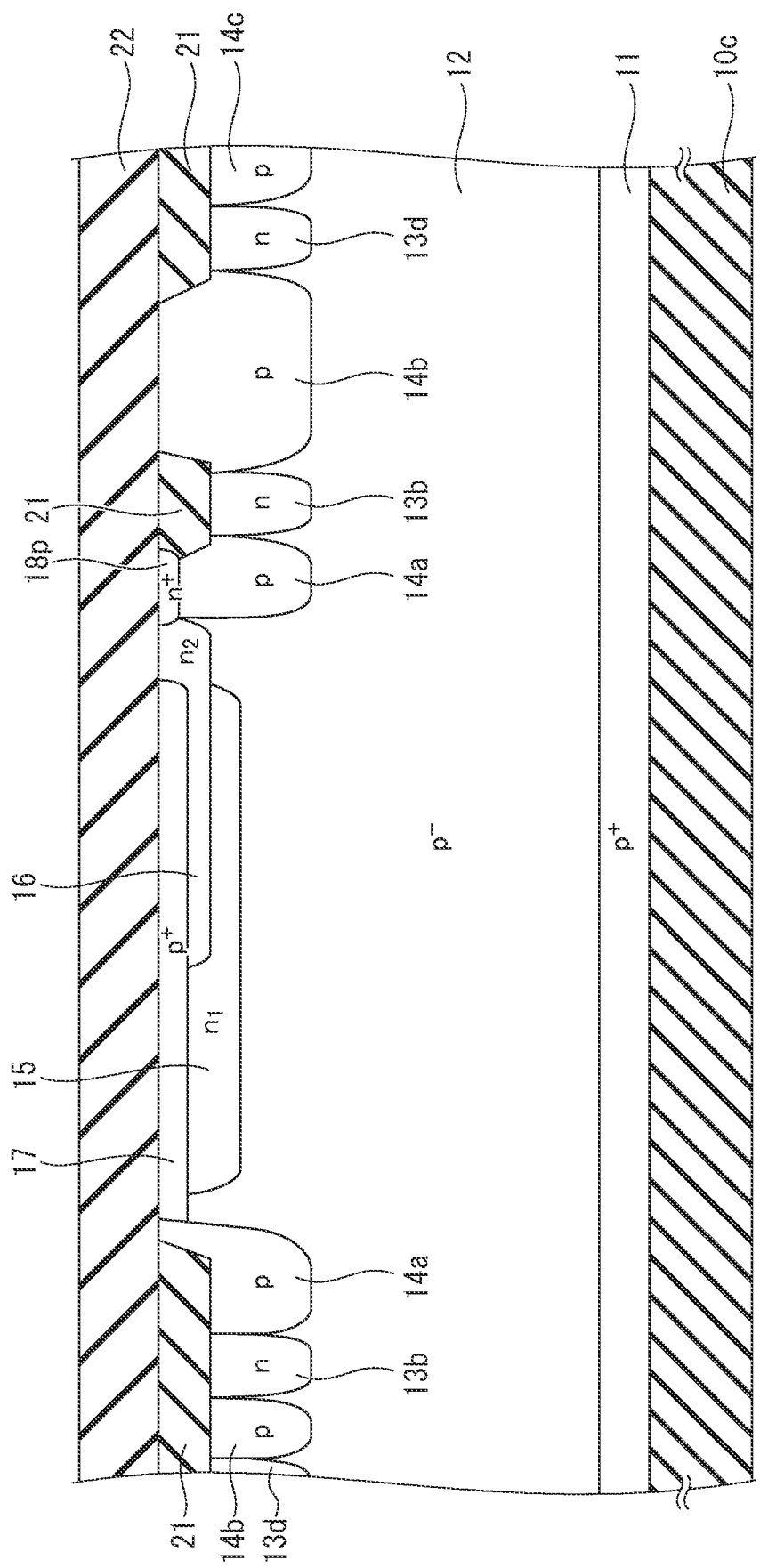
FIG. 23 is a yet still another schematic cross-sectional view illustrating an outline of a cross-section structure of a pixel in a solid-state imaging device pertaining to a yet still another embodiment, as one example (example No. 3)

The explanation of the embodiment based on the use of FIG. 3 exemplarily explains a case in which the depletion-layer extension-promotion region (10a and 11) is constructed by the p-type semiconductor substrate 10a and the $p^+$ type bottom-side bias-layer 11 arranged on the semiconductor substrate 10a. However, the architecture is not limited to the structure using the p-type semiconductor substrate 10a, as already described in the explanation of the embodiment. Thus, even in the design of the solid-state imaging device pertaining to the embodiment and its modification, a depletion-layer extension-promotion region (10b and 11) may be implemented by an n-type semiconductor substrate 10b illustrated in FIG. 22, instead of using the p-type semiconductor substrate 10a, and a depletion-layer extension-promotion region (10c and 11) may be implemented by an insulator substrate 10c illustrated in FIG. 23.

Figure 24:
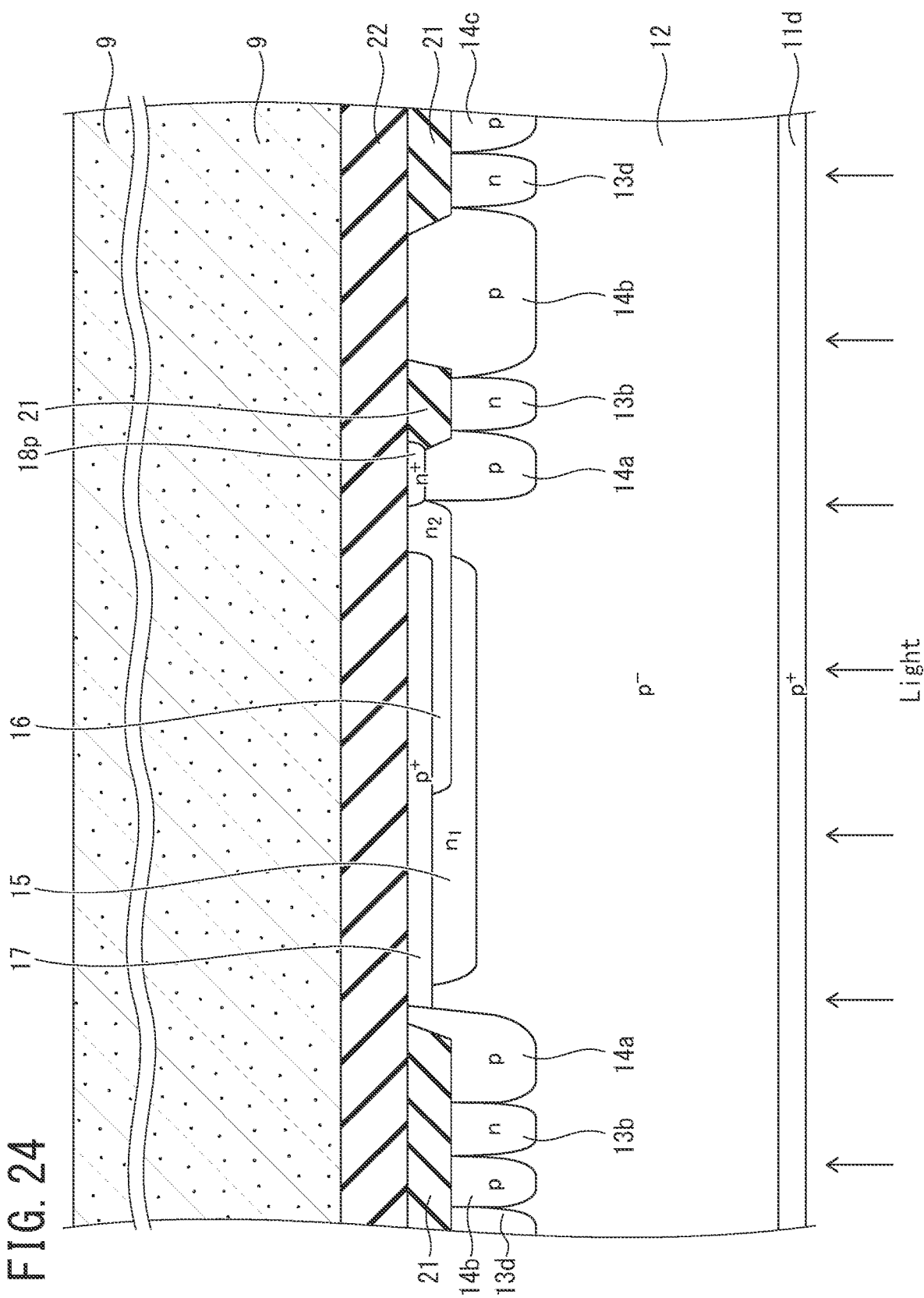
FIG. 24 is a yet still another schematic cross-sectional view illustrating an outline of a cross-section structure of a pixel in a solid-state imaging device pertaining to a yet still another embodiment, as one example (example No. 4)

Moreover, as illustrated in FIG. 24, a $p^+$ type semiconductor substrate 11d itself may be employed as a depletion-layer extension-promotion region (11d) as a single component. In the structure illustrated in FIG. 24, "the upper layer" of the depletion-layer extension-promotion region (11d) shall be defined as the upper portion of the $p^+$ type semiconductor substrate 11d. Thus, the upper layer of the semiconductor substrate 11d and the semiconductor substrate 11d merges into a same region. In a structure illustrated in FIG. 24, in view of an attenuation distance of light, a solid-state imaging device of back-side-illuminated type is preferably designed in such a way that a thickness of the $p^+$ type semiconductor substrate 11d is thinned to be five to ten micrometers or less by performing a polishing work, CMP and the like. When the semiconductor substrate 11d is thinned, as illustrated in FIG. 24, it is preferred to support a mechanical strength by coupling a support substrate 9, such as Si substrate and the like, through the inter-layer insulating film 22 on the top surface by a bonding method and the like. Although illustration is omitted, a deep trench (penetration hole) penetrating through the photoelectric conversion layer 12 is dug around a chip by ion milling or an RIE method, and p-type impurities may be diffused onto a side wall of the penetration hole. Moreover, a scheme that a part of the bottom-voltage supply-portion is implemented by TSV, embedding DOPOS or refractory metal such as W, Ti and the like, in the penetration hole is available, similar to the explanation in FIG. 4.

Figure 25:
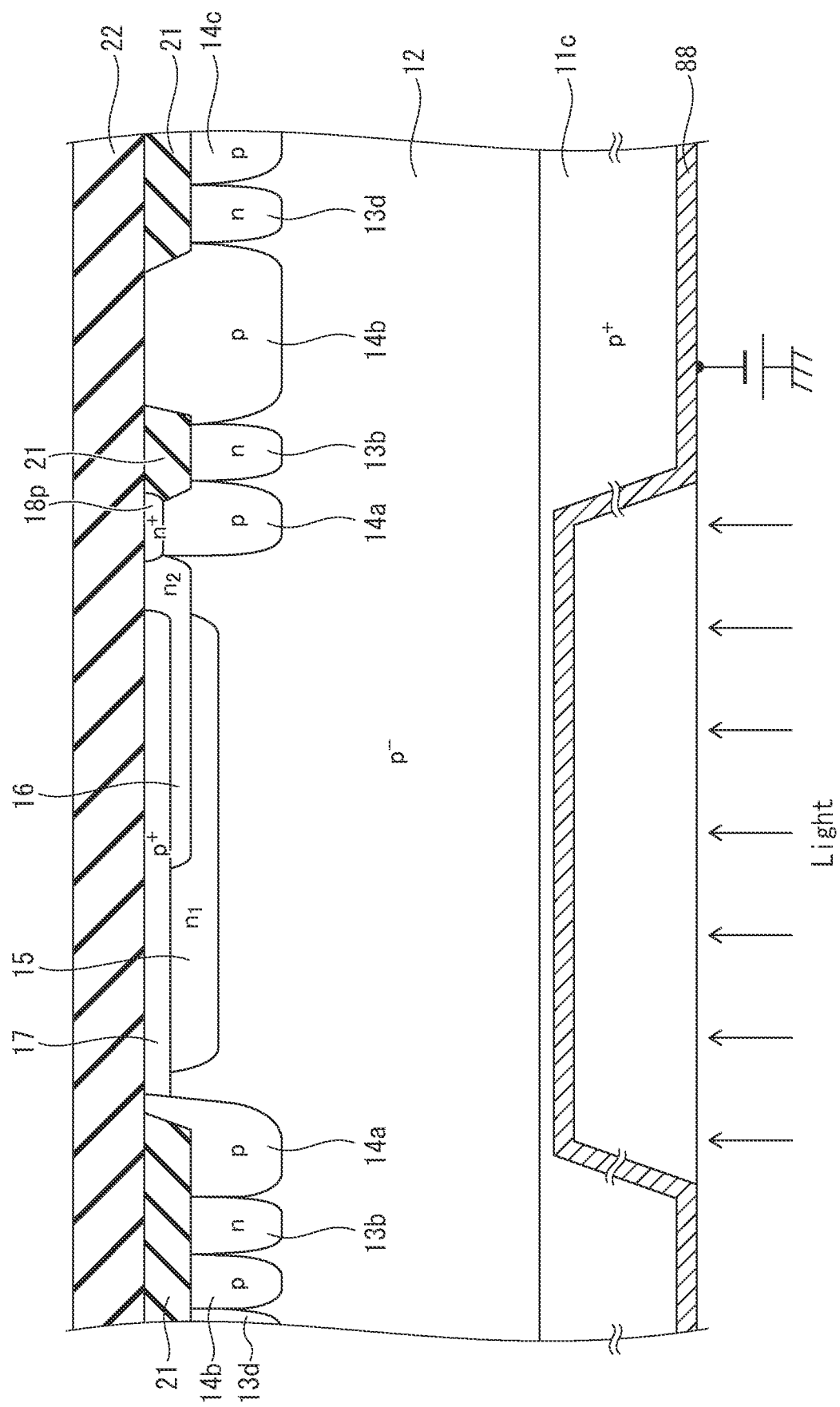
FIG. 25 is a yet still another schematic cross-sectional view illustrating an outline of a cross-section structure of a pixel in a solid-state imaging device pertaining to a yet still another embodiment, as one example (example No. 5)

Moreover, as illustrated in FIG. 25, by providing a concave portion in which only a selected region of the $p^+$ type semiconductor substrate 11c just under the surface-buried region 15 is selectively dug to five to ten micrometers or less so that a single body of the semiconductor substrate 11c can be used as the depletion-layer extension-promotion region (11c). In a structure illustrated in FIG. 25, the solid-state imaging device of back-side-illuminated type can be manufactured if a bottom surface electrode 88, which is scheduled to be provided on a bottom surface of the semiconductor substrate 11c, is constructed by a transparent electrode made of polycrystalline silicon, tin oxide ($SnO_2$), indium (In) doped tin oxide (ITO), zinc (Zn) doped tin oxide (ZTO), gallium (Ga) doped tin oxide (GTO), and aluminum (Al) doped tin oxide (ATO). In order to manufacture the solid-state imaging device of back-side-illuminated type, it is not necessary to bond the support substrates 9 to each other as illustrated in FIG. 24, because a thickness of a limited portion of the semiconductor substrate 11c serving as an effective photodiode is set to five to ten micrometer or less so that the mechanical strength can be ensured by the thick portion of the semiconductor substrate 11c, which is delineated into a frame-shape.

Figure 26:
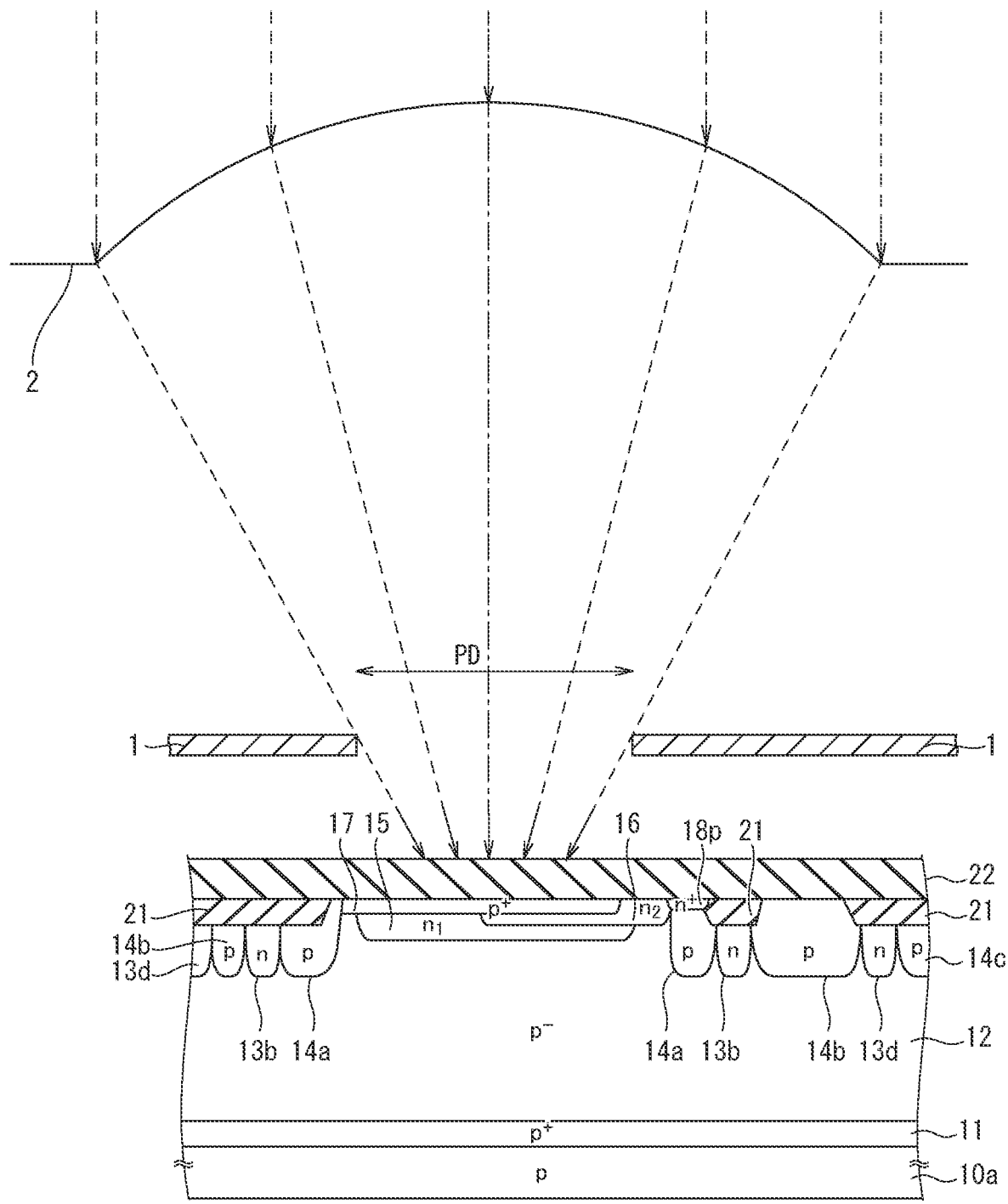
FIG. 26 is a yet still another schematic cross-sectional view illustrating an outline of a cross-section structure of a pixel in a solid-state imaging device pertaining to a yet still another embodiment, as one example (example No. 6)

Moreover, for example, as illustrated in FIG. 26, a micro lens 2 for entering a light into a light receiving area PD, by converging the light from a target object may be placed on an upper side of a shield plate 1. By illuminating the light through the micro lens 2, an opening ratio can be improved, which can make a sensitivity of the solid-state imaging device higher. By the photoelectric conversion element pertaining to the other embodiments illustrated in FIG. 26, compatible technical advantages directed to two object such that generating the potential profile in the pixel, for transporting the signal charges at high-speed, and that performing the high-speed transport with low power dissipation can be achieved, similarly to the photoelectric conversion elements illustrated in FIGS. 2 to 4 and FIGS. 16 to 24. By the way, the micro lens is not limited to a single-level structure exemplified in FIG. 26. It is possible to achieve further miniaturization by laminating the micro lens on the photoelectric conversion element in a composite structure with double level or more levels.

In the already-described explanation of the embodiments, the first conductivity type is explained as p-type, and the second conductivity type is n-type. However, even if the first conductivity type is assigned to n-type and the second conductivity is p-type, it may be easily understood that the similar effectiveness can be achieved by making the electric polarities opposite to each other. For example, when electric polarities are reversed, the surface-buried region 15 illustrated in FIG. 3 shall be defined as "a light-receiving anode-region". Also, in the explanation of the embodiment, the signal charges are explained as electrons, and the non-signal charges whose conductivity type is opposite to the signal charges are explained as hole. However, when the polarity is reversed, it is obvious that the signal charges are assigned to holes, and the non-signal charges are assigned to electrons.

In the explanation of the embodiment, the two-dimensional solid-state imaging device (area sensor) is explained exemplarily. However, the pixel $X_{ij}$ in the present invention should not be construed to be used only for the pixel $X_{ij}$ in the two-dimensional solid-state imaging device. For example, an architecture that a plurality of the pixels $X_{ij}$ are arrayed one-dimensionally for implementing one-dimensional solid-state imaging device (line sensor), in which j=m=1 is defined for the two-dimensional matrix illustrated in FIG. 1, can be available from the content of the above disclosure.

In the above explanations, although a target element to be divided by the tab-regions of the second conductivity type (n-type) is explained as the well region of a single pixel, the above explanations are merely examples. For example, it may include a structure in which the target element to be divided by the tab-region may be a well region lying in a boundary of two pixels, the two pixels are coupled in a mirror image symmetry. That is, it is also possible to select two pairs of pixels from the pixel array illustrated in FIG. 1, and to define the two pairs of pixels as a pixel unit, which is the target element to be divided, and a well region commonly existing in the pixel unit is divided by the tab-regions. Thus, in a structure of a pixel unit implemented by a set of four pixels, the well region commonly existing in the pixel unit is effectively divided by the tab-regions. Thus, the structure of the tab-regions in the present invention can include a topology in which a large well region common to a plurality of pixels arranged adjacent to each other is effectively divided into n (n is a positive integer of two or more). In this case, the well regions divided by the tab-regions are assigned respectively to each of the pixels arranged adjacent to each other.

In this way, it is obvious that the present invention includes various embodiments and the like that are not detailed above. Thus, the technical scope of the present invention is determined only by the technical features specifying the invention prescribed by following Claims, reasonable from the above explanations.

REFERENCE SIGNS LIST 1 a shield plate
2 a micro lens
10a, 10b an insulator substrate
11, 11b a bottom-side bias-layer
12$_{dep}$ a depletion layer
12 a photoelectric conversion layer
13b a first n-tab
13d a second n-tab
43 a p-well
14a a first p-well
14b a second p-well
14c a third p-well
15 a surface-buried region
16 a guide region
17 a pinning layer
18p, 18q, 18r, 18s a charge-accumulation region
28 a gate electrode film
21 an element-isolation insulating-film
22 an interlayer insulating film
23c, 28c an exhaust-gate electrode
23$r_1$, 23$r_2$, 23p, 23q, 23r, 23s an electric-field control-electrode
26, 26q a reset gate electrode
29 a DOPOS layer
32, 33, 69, 69a, 69b, 85, 85a, 85b a surface interconnection
41 a shield region
42 a sinker region
44 an n-well
45 a tab-region
46, 46a, 46b a p-well contact region
51, 52 a photo resist area
62 a sinker contact region
63 a p-well contact region
64, 66 a source region
65, 67 a drain region
68 an n-well contact region
71, 72, 71q, 72q a gate electrode
84, 84a, 84b an n-tab contact region
88 a surface electrode
91, 92, 93, 91q, 92q, 93q a drain electrode
104 a timing generator
105 a vertical shift register
106 a horizontal shift register

The invention claimed is:

1. A photoelectric conversion element, comprising:
a depletion-layer extension-promotion region having an upper layer of a first conductivity type;
a photoelectric conversion layer of the first conductivity type in contact with the upper layer of the depletion-layer extension-promotion region, having a lower impurity concentration than the upper layer;
a surface-buried region of a second conductivity type buried in a part of an upper portion of the photoelectric conversion layer, configured to implement a photo-diode together with the photoelectric conversion layer;
a well region of the first conductivity type buried in another part of the upper portion of the photoelectric conversion layer, having higher impurity concentration than the photoelectric conversion layer;
a charge-accumulation region of the second conductivity type buried in a part of an upper portion of the well region, configured to accumulate signal charges temporally;
a plurality of intra-pixel circuit-elements merged in a part of the well region, configured to implement a circuit for reading out the signal charges from the charge-accumulation region; and
an injection-blocking element having a tab-region of the second conductivity type for dividing the well region into no less than two at least at a part of the well region, configured to block injection of non-signal charges having opposite conductivity type to the signal charges from the well region into the photoelectric conversion layer,
wherein an entire range intended as a signal-charge generation-region in the photoelectric conversion layer is depleted by a voltage applied to the upper layer.

2. The photoelectric conversion element of the claim 1, wherein in at least at a part of the well region, the injection-blocking element includes double tab-regions of the second conductivity type for dividing the well region into three, and potentials, associated with electric field lines radiating out from lower ends of the double tab-regions respectively, generate a potential barrier which blocks the injection of the non-signal charges, at a position under the well regions between the double tab-regions.

3. A solid-state imaging device merged in a single semiconductor chip, comprising:
- a depletion-layer extension-promotion region having an upper layer of a first conductivity type;
- a pixel-array area having an array of a plurality of pixels merged in the semiconductor chip, each of the pixels including:
  - a photoelectric conversion layer of the first conductivity type in contact with the upper layer of the depletion-layer extension-promotion region, having a lower impurity concentration than the upper layer;
  - a surface-buried region of a second conductivity type buried in a part of an upper portion of the photoelectric conversion layer, configured to implement a photodiode together with the photoelectric conversion layer;
  - a well region of the first conductivity type buried in another part of the upper portion of the photoelectric conversion layer, having higher impurity concentration than the photoelectric conversion layer;
  - a charge-accumulation region of the second conductivity type buried in a part of an upper portion of the well region, configured to accumulate signal charges temporally;
  - a plurality of intra-pixel circuit-elements merged in a part of the well region, configured to implement a circuit for reading out the signal charges from the charge-accumulation region; and
  - an injection-blocking element having a tab-region of the second conductivity type for dividing the well region into no less than two at least at a part of the well region, configured to block injection of non-signal charges having opposite conductivity type to the signal charges from the well region into the photoelectric conversion layer,
- a peripheral-circuit area merged in the semiconductor chip around the pixel-array area, configured to drive the pixels and process signals from the pixels,
- wherein, in each of the pixels, an entire range intended as a signal-charge generation-region in the photoelectric conversion layer is depleted by a voltage applied to the upper layer.

4. The solid-state imaging device of the claim 3, further comprising a bottom-voltage supply-portion for supplying a bottom voltage to the depletion-layer extension-promotion region, in a periphery of the semiconductor chip,
- wherein the bottom-voltage supply-portion supplies a bottom voltage to the depletion-layer extension-promotion region.

5. The solid-state imaging device of the claim 4, wherein the bottom-voltage supply-portion has:
- a tab-region of the first conductivity type arranged in the periphery of the semiconductor chip, and
- a tab contact region of the first conductivity type buried in an upper portion of the tab-region, having higher impurity concentration than the tab-region.

6. The solid-state imaging device of any one of the claim 5 wherein, at a part of the well region, the injection-blocking element includes double tab-regions of the second conductivity type for dividing the well region into three at least, and potentials, associated with electric field lines radiating out from lower ends of the double tab-regions respectively, generate a potential barrier which blocks the injection of the non-signal charges, at a position under the well region between the double tab-regions.

7. The solid-state imaging device of claim 4 wherein, at a part of the well region, the injection-blocking element includes double tab-regions of the second conductivity type for dividing the well region into three at least, and potentials, associated with electric field lines radiating out from lower ends of the double tab-regions respectively, generate a potential barrier which blocks the injection of the non-signal charges, at a position under the well region between the double tab-regions.

8. The solid-state imaging device of claim 3 wherein, at a part of the well region, the injection-blocking element includes double tab-regions of the second conductivity type for dividing the well region into three at least, and potentials, associated with electric field lines radiating out from lower ends of the double tab-regions respectively, generate a potential barrier which blocks the injection of the non-signal charges, at a position under the well region between the double tab-regions.

* * * * *